US009786796B2

(12) United States Patent
Nakamura

(10) Patent No.: US 9,786,796 B2
(45) Date of Patent: Oct. 10, 2017

(54) SEMICONDUCTOR DEVICE HAVING FIRST AND SECOND LAYERS WITH OPPOSITE CONDUCTIVITY TYPES

(71) Applicant: MITSUBISHI ELECTRIC CORPORATION, Chiyoda-ku (JP)

(72) Inventor: Katsumi Nakamura, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 36 days.

(21) Appl. No.: 14/688,640

(22) Filed: Apr. 16, 2015

(65) Prior Publication Data

US 2015/0221781 A1 Aug. 6, 2015

Related U.S. Application Data

(62) Division of application No. 12/716,427, filed on Mar. 3, 2010, now Pat. No. 9,035,434.

(30) Foreign Application Priority Data

Jun. 4, 2009 (JP) .................................. 2009-135077

(51) Int. Cl.
*H01L 29/02* (2006.01)
*H01L 29/861* (2006.01)
(Continued)

(52) U.S. Cl.
CPC ........ *H01L 29/861* (2013.01); *H01L 29/0834* (2013.01); *H01L 29/36* (2013.01); *H01L 29/7397* (2013.01); *H01L 29/8618* (2013.01)

(58) Field of Classification Search
CPC ............... H01L 29/861; H01L 29/8618; H01L 29/0834; H01L 29/36
(Continued)

(56) References Cited

U.S. PATENT DOCUMENTS 4,587,547 A 5/1986 Amemiya et al.
5,162,876 A 11/1992 Kitagawa et al.
(Continued)

FOREIGN PATENT DOCUMENTS

DE 197 50 827 A1 5/1999
JP 2-66977 3/1990
(Continued)

OTHER PUBLICATIONS

A. Kopta, et al., "The Field Charge Extraction (FCE) Diode a Novel Technology for Soft Recovery High Voltage Diodes", Proceedings of the 17th International Symposium on Power Semiconductor Devices & IC's, May 23-26, 2005, pp. 83-86.
(Continued)

*Primary Examiner* — Robert Huber
(74) *Attorney, Agent, or Firm* — Oblon, McClelland, Maier & Neustadt, L.L.P.

(57) ABSTRACT

A semiconductor device having first through third layers. The first layer has a conductivity type that is different from a conductivity type of the second layer. A peak value of an impurity concentration of a portion of the third layer is greater than a peak value of an impurity concentration of the second layer. The semiconductor device allows a decrease in the forward voltage drop and also allows an improvement of the safe operating area tolerance. Thus, it is possible to decrease the forward voltage drop, improve the maximum reverse voltage, and suppress oscillations at the time of recovery.

8 Claims, 19 Drawing Sheets

(51) Int. Cl.
*H01L 29/08* (2006.01)
*H01L 29/739* (2006.01)
*H01L 29/36* (2006.01)

(58) Field of Classification Search
USPC ............ 257/487, 493, 603, 655, E29.327, 257/E29.335
See application file for complete search history.

(56) References Cited

U.S. PATENT DOCUMENTS

| | | | |
|---|---|---|---|
| 5,508,534 | A | 4/1996 | Nakamura et al. |
| 5,578,522 | A | 11/1996 | Nakamura et al. |
| 5,751,024 | A * | 5/1998 | Takahashi ............ H01L 29/7397 257/139 |
| 6,661,054 | B1 | 12/2003 | Nakamura |
| 6,710,401 | B2 | 3/2004 | Nakamura et al. |
| 7,067,874 | B2 | 6/2006 | Nakamura et al. |
| 8,766,317 | B2 * | 7/2014 | Takaishi ............. H01L 29/7302 257/135 |
| 2001/0045566 | A1 | 11/2001 | Takahashi et al. |
| 2009/0114982 | A1 * | 5/2009 | Saka ................. H01L 29/4236 257/330 |

FOREIGN PATENT DOCUMENTS

| | | |
|---|---|---|
| JP | 2-76265 | 3/1990 |
| JP | 5-335600 | 12/1993 |
| JP | 7-106605 | 4/1995 |
| JP | 7-263692 | 10/1995 |
| JP | 8-172205 | 7/1996 |
| JP | 9-139510 | 5/1997 |
| JP | 10-93113 | 4/1998 |
| JP | 11-26780 | 1/1999 |
| JP | 11-097715 | 4/1999 |
| JP | 2001-85686 | 3/2001 |
| JP | 2001-196606 | 7/2001 |
| JP | 2004-186413 | 7/2004 |
| JP | 2006-49455 | 2/2006 |
| JP | 2006-173297 | 6/2006 |
| JP | 2007-134625 | 5/2007 |
| JP | 2007-158320 | 6/2007 |
| JP | 2008-205252 | 9/2008 |
| JP | WO 2008156070 A1 * | 12/2008 ......... H01L 29/7302 |
| WO | WO00/16408 | 3/2000 |

OTHER PUBLICATIONS

A. Kopta, et al., "New Plasma Shaping Technology for Optimal High Voltage Diode Performance", EPE 2007 Aalborg, pp. 1-10.
Office Action dated Dec. 13, 2011, in Japanese Patent Application No. 2009-135077 (with English-language translation).
Japanese Office Action dated Apr. 2, 2013 for Japanese Patent Application 2012-022990 with English translation.
German Office Action dated Jul. 12, 2012, issued for German Application No. 10 2010 028 978.7 (with English translation).

* cited by examiner

SEMICONDUCTOR DEVICE HAVING FIRST AND SECOND LAYERS WITH OPPOSITE CONDUCTIVITY TYPES

CROSS-REFERENCE TO RELATED APPLICATIONS

This application is a division of U.S. Ser. No. 12/716,427 filed Mar. 3, 2010, the entire content of which is incorporated herein by reference, and claims the benefit of priority under 35 U.S.C. §119 from, Japanese Patent Application No. 2009-135077 filed Jun. 4, 2009.

BACKGROUND OF THE INVENTION

Field of the Invention

The present invention relates to a semiconductor device, and particularly to a power semiconductor device.

Description of the Background Art

A power semiconductor device includes a high breakdown voltage power module which can withstand a voltage of, for example, 600 V or higher. Such a power module may have a diode formed thereon.

For example, Japanese Patent Laying-Open No. 02-066977 discloses a diode having a pn junction formed by an n$^-$ layer adjacent to a p layer, in which an n$^+$ region and a p$^+$ region are located on the surface of the if layer opposite to the p$^+$ layer. In addition, an n buffer layer is located between the if layer and the region including the n$^+$ region and the p$^+$ region. This document discloses that the p$^+$ region has an effect of reducing a reverse recovery current of the diode and also shortening the reverse recovery time. It also discloses that the n buffer layer can prevent the depletion layer from extending to the if n$^-$ layer during application of the reverse voltage, which allows a reduction in thickness of the n$^-$ layer, with the result that the reverse recovery characteristics of the high breakdown voltage diode can be improved.

Furthermore, for example, Japanese Patent Laying-Open No. 08-172205 discloses a diode including an n$^-$ semiconductor layer formed on one main surface of an n-type semiconductor substrate; an n$^+$ cathode region formed on the surface layer of the n$^-$ semiconductor layer; a trench extending from the surface of the n$^+$ cathode region through the n$^-$ semiconductor layer to the n-type semiconductor substrate; a gate electrode filling the trench with a gate oxide film interposed therebetween; an insulation film formed on the gate electrode; a cathode electrode in contact with the surface of the n$^+$ cathode region interposed between the trenches; a p$^+$ anode region formed on a part of the surface layer of the n-type semiconductor substrate; and an anode electrode in contact with the p$^+$ anode region. According to this document, as the gate electrode is applied with a voltage which is negative with respect to the cathode electrode, a breakdown of the diode and burning of the switching transformer can be prevented when an overcurrent flows through the diode.

With regard to the power diode, it is difficult to solve the problems involved in both of the tasks of decreasing a forward voltage drop ($V_F$) and suppressing the oscillation at the time of recovery (reverse recovery). For example, Japanese Patent Laying-Open No. 02-066977 as described above merely discloses that the recovery characteristics can be improved by providing a p$^+$ region, but fails to disclose how to configure the p$^+$ region for allowing the above-described problems to be solved in a balanced manner.

Furthermore, it may be desirable to especially decrease $V_F$ depending on the use of the power diode. However, according to the technique disclosed in Japanese Patent Laying-Open No. 08-172205 described above, the gate electrode is applied with a voltage that is negative with respect to the cathode electrode, which causes a problem of an increase in $V_F$.

SUMMARY OF THE INVENTION

The present invention has been made in light of the above-described problems, and an object of the present invention is to provide a semiconductor device capable of decreasing $V_F$ and suppressing the oscillation at the time of recovery. Furthermore, another object of the present invention is to provide a semiconductor device capable of particularly decreasing $V_F$.

A semiconductor device according to one aspect of the present invention includes first and second electrodes, and first to fourth layers. The first layer is located on the first electrode and has a first conductivity type. The second layer is located on the first layer and has a second conductivity type different from the first conductivity type. The third layer is located on the second layer. The second electrode is located on the third layer. The fourth layer is located between the second layer and the third layer, and has the second conductivity type. The third layer includes first and second portions. The first portion has the second conductivity type and has a peak value of an impurity concentration higher than the peak value of the impurity concentration in the second layer. The second portion has the first conductivity type. An area of the second portion accounts for not less than 20% and not more than 95% of a total area of the first and the second portions.

A semiconductor device according to another aspect of the present invention includes first and second electrodes, first to third layers, and a trench structure. The first layer is located on the first electrode and has a first conductivity type. The second layer is located on the first layer and has a second conductivity type different from the first conductivity type. The third layer is located on the second layer and has a first portion. The first portion has the second conductivity type and has a peak value of an impurity concentration higher than the peak value of the impurity concentration in the second layer. The second electrode is located on the third layer. The trench structure is located in the first portion and applied with an electric potential which is positive with respect to an electric potential of the second electrode.

The semiconductor device according to an aspect of the present invention allows a decrease in $V_F$ of a diode and also allows suppression of the oscillation at the time of recovery.

The semiconductor device according to another aspect of the present invention allows a decrease in $V_F$ of the diode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the drawings.

(First Embodiment)

Figure 1:
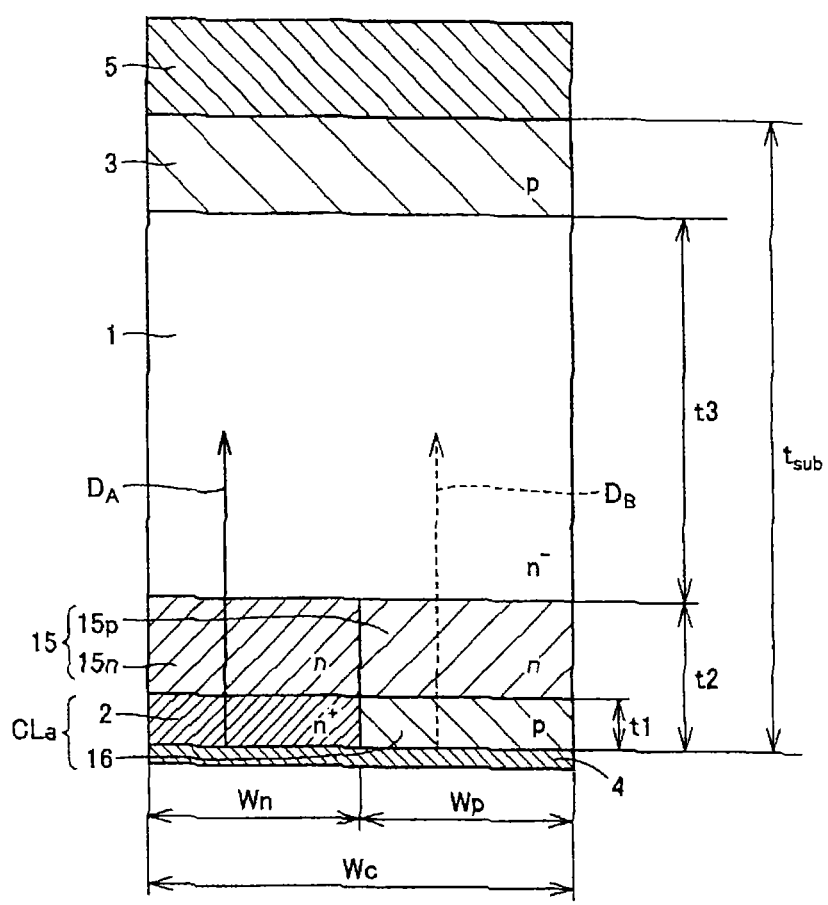
FIG. 1 is a cross-sectional view schematically showing the configuration of a diode as a semiconductor device according to the first embodiment of the present invention.

Referring to FIG. 1, a diode as a semiconductor device according to the present embodiment includes an anode electrode 5 (the first electrode), a p layer 3 (the first layer), an n⁻ drift layer 1 (the second layer), an n layer 15 (the fourth layer), a cathode layer CLa (the third layer), and a cathode electrode 4 (the second electrode). For example, p layer 3, n⁻ drift layer 1, n layer 15, and cathode layer CLa are, for example, made of Si to which conductive impurities are added.

P layer 3 is located on (in the figure, immediately below) anode electrode 5 and has a p-type (the first conductivity type).

N⁻ drift layer 1 is located on (in the figure, immediately below) p layer 3 to have a thickness of a dimension t3. Furthermore, n⁻ drift layer 1 has a conductivity type different from a p-type, that is, an n-type (the second conductivity type).

Cathode layer CLa is located on (in the figure, below) n⁻ drift layer 1 with n layer 15 interposed therebetween. Cathode layer CLa is in a rectangular shape having a width $W_c$ in plan view taken at right angles to the width direction. Cathode layer CLa also includes an n⁺ region 2 (the first portion) having an n-type and a p region 16 (the second portion) having a p-type.

Furthermore, in the present embodiment, n⁺ region 2 and p region 16 are each in a rectangular shape having a width $W_n$ and a width $W_p$, respectively, in plan view. Cathode layer CLa, n+ region 2 and p region 16 are identical in length (at right angles to the width) in plan view. Width $W_c$, width $W_n$ and width $W_p$ establish the relationship of $W_c=W_n+W_p$. Consequently, the ratio of the area of n+ region 2 to the area of p region 16 in plan view is $W_n:W_p$. Furthermore, cathode layer CLa is formed such that the following expression is satisfied.

$$0.2 \leq W_p/W_c \leq 0.95$$

Accordingly, the area of p region 16 accounts for not less than 20% and not more than 95% of the total area of n+ region 2 and p region 16 on n layer 15.

It is to be noted that a dimension t1 in the figure is equivalent to each thickness of n+ region 2 and p region 16 which is, for example, 0.2 to 5 μm. Furthermore, a dimension $t_{sub}$ is equivalent to the entire thickness of the semiconductor layer.

N layer 15 is located between n− drift layer 1 and cathode layer CLa, and has an n-type (the second conductivity type). Furthermore, n layer 15 has a thickness of a dimension obtained by subtracting dimension t1 from a dimension t2 in the figure, which is 1 to 50 μm, for example. N layer 15 has an n region 15n (the third portion) located on n+ region 2 and an n region 15p (the fourth portion) located on p region 16.

In addition, n layer 15 substantially contains only the n-type conductive impurities but does not substantially contain the p-type conductive impurities.

Cathode electrode 4 is located on cathode layer CLa.

Figure 2:
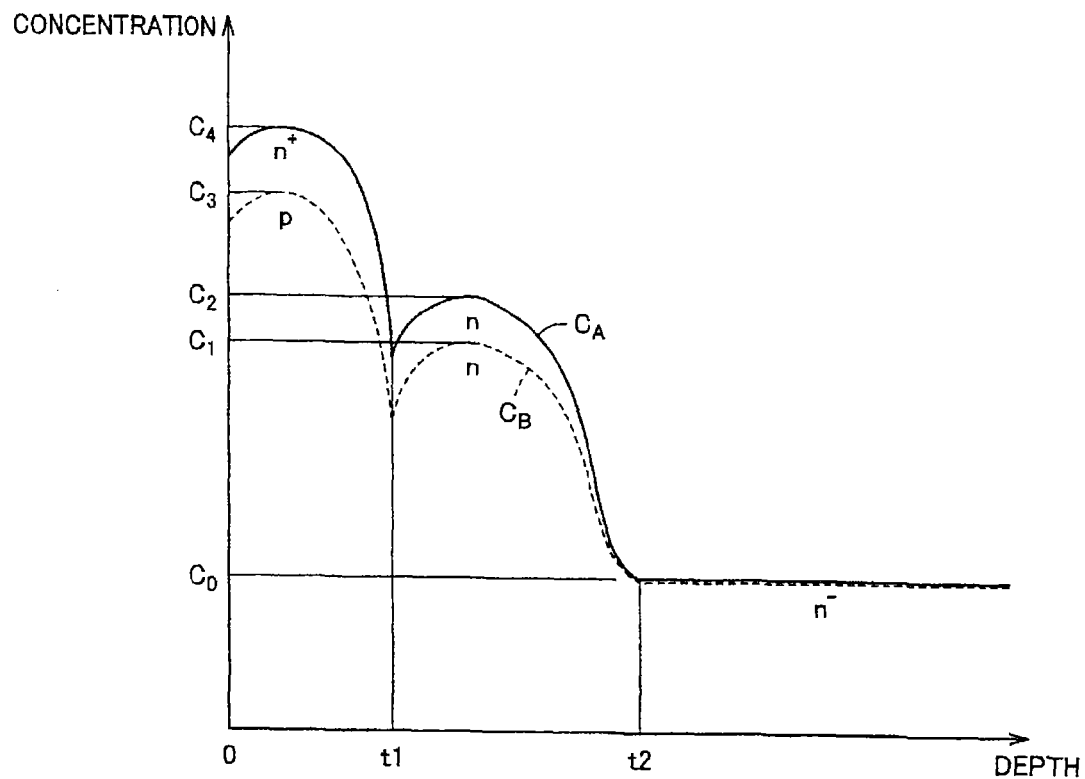
FIG. 2 is a graph schematically showing impurity profiles $C_A$ and $C_B$ along arrows $D_A$ and $D_B$, respectively, in FIG. 1.

Referring to FIG. 2, impurity profiles $C_A$ and $C_B$ each show a distribution of the impurity concentration in depths $D_A$ and $D_B$, respectively (FIG. 1). N+ region 2 has a peak value $C_4$ of an impurity concentration higher than a peak value $C_0$ of the impurity concentration in n− drift layer 1, and also higher than a peak value $C_3$ of the impurity concentration in p region 16. The ratio of a peak value $C_1$ of the impurity concentration in n region 15p to peak value $C_3$ of the impurity concentration in p region 16 is not less than 0.001 and not more than 0.1. N layer 15 has peak values $C_1$ and $C_2$ of the impurity concentration higher than peak value $C_0$ of the impurity concentration in n− drift layer 1 and lower than peak value $C_4$ of the impurity concentration in n+ region 2 of cathode layer CLa.

For example, the surface concentration of n+ region 2 is $1 \times 10^{17}$ to $1 \times 10^{21}$ cm$^{-3}$, and the surface concentration of p region 16 is $1 \times 10^{16}$ to $1 \times 10^{21}$ cm$^{-3}$.

Furthermore, peak values $C_1$ and $C_2$ of the impurity concentration in n layer 15 each are $1 \times 10^{16}$ to $1 \times 10^{20}$ cm$^{-3}$.

In the present embodiment, n layer 15 substantially contains only the n-type conductive impurities, but does not substantially contain the p-type conductive impurities. Thus, impurity profile $C_B$ within a section between dimensions t1 and t2 in FIG. 2 shows the concentration of the n-type conductive impurities. In the case where n region 15p also substantially contains the p-type conductive impurities in addition to the n-type conductive impurities, the impurity concentration means an effective impurity concentration, that is, a concentration difference between the p-type and n-type conductive impurities.

Figure 26:
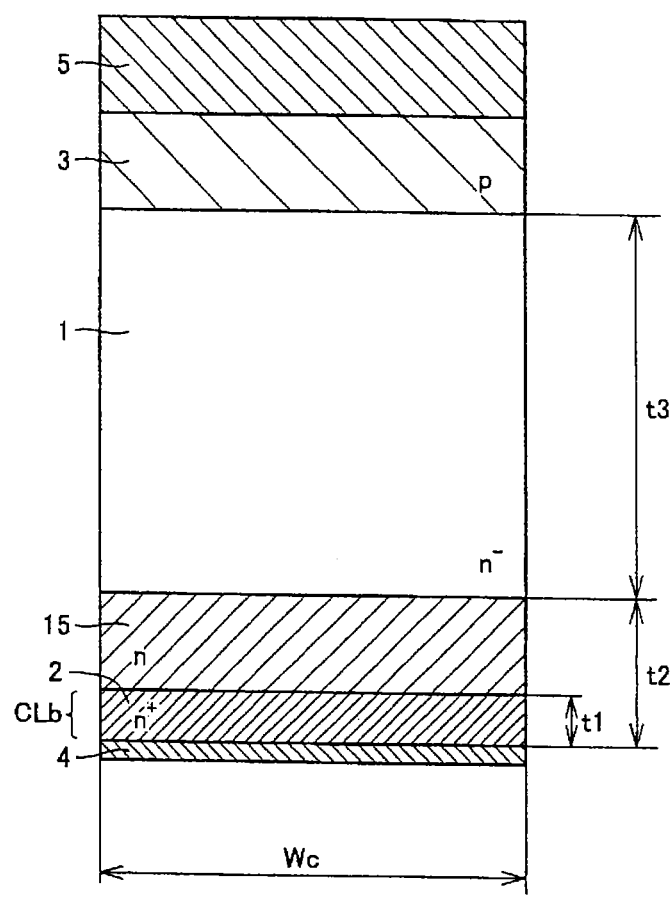
FIG. 26 is a cross-sectional view showing the configuration of the diode in the comparative example.

The diode according to a comparative example will then be described. Referring to FIG. 26, the diode in the comparative example has a cathode layer CLb including n+ region 2, in place of cathode layer CLa according to the present embodiment. N layer 15 is located immediately on cathode layer CLb. The following two problems may be caused in this comparative example.

As to the first problem, during the recovery operation, it is more likely that the hole concentration remaining on the side close to n+ region 2 and n layer 15 decreases and a depletion layer extends. The oscillation phenomenon occurs at the instant when this depletion layer reaches n layer 15. Consequently, the safe operating area (SOA) tolerance and the recovery tolerance are reduced.

As to the second problem, in order to address the oscillation phenomenon during recovery, it is necessary to delay extension of the depletion layer from the junction of p layer 3/n− drift layer 1 serving as a main junction toward the cathode side.

This requires an increase in dimension t3 corresponding to the thickness of the n− drift layer in the present comparative example. As a result, it becomes difficult to improve the trade-off characteristics between a decrease in $V_F$ and a recovery loss ($E_{REC}$).

In the comparative example, dimension t3 is set to be relatively short which causes the above-described first problem, and dimension t3 is set to be relatively long which causes the above-described second problem. Thus, in the present comparative example, it is difficult to achieve an improvement of the trade-off characteristics between a decrease in $V_F$ and recovery loss, and also achieve an improvement of the SOA tolerance by suppression of the oscillation phenomenon and the like.

In contrast, the present embodiment allows a decrease in $V_F$ and also allows an improvement of the SOA tolerance while ensuring a high breakdown voltage. In other words, it becomes possible to decrease $V_F$, improve the maximum reverse voltage, and suppress the oscillation at the time of recovery.

Figure 3:
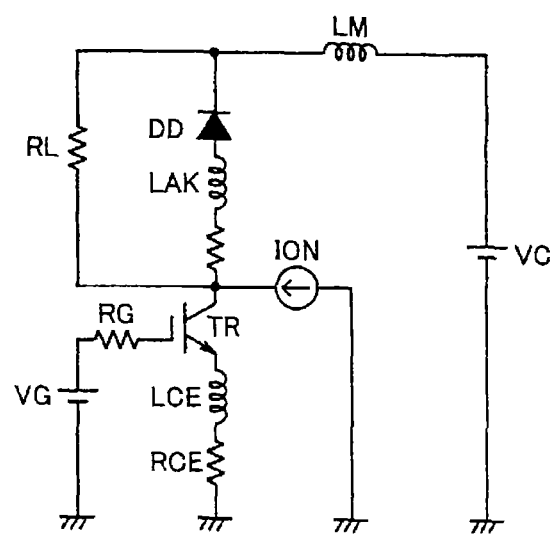
FIG. 3 is a diagram showing a circuit used for each simulation for the diode in FIG. 1 and a comparative example thereof.

Referring to FIG. 3, in order to verify the above-described operations and effects, simulations were performed for the circuit including a diode rated at 3300V class as an example of the semiconductor device according to the present embodiment. This circuit includes a diode DD, a transistor TR corresponding to an IGBT (Insulated Gate Bipolar Transistor), coils LM, LAK and LCE, resistances RL, RAK, RCE, and RG, power supplies VC and VG, and a current source ION. Coil LM is provided for a parasitic inductance, resistance RG is provided for the gate resistance of the IGBT, and power supply VG is provided for the gate voltage of the IGBT. Furthermore, coils LAK and LCE are provided for a wiring impedance for providing matching between the measured results and the simulation results. Resistances RL, RAK and RCE are provided for a wiring-related resistance for providing matching between the measured results and the simulation results. The simulation results will be hereinafter described.

Figure 4:
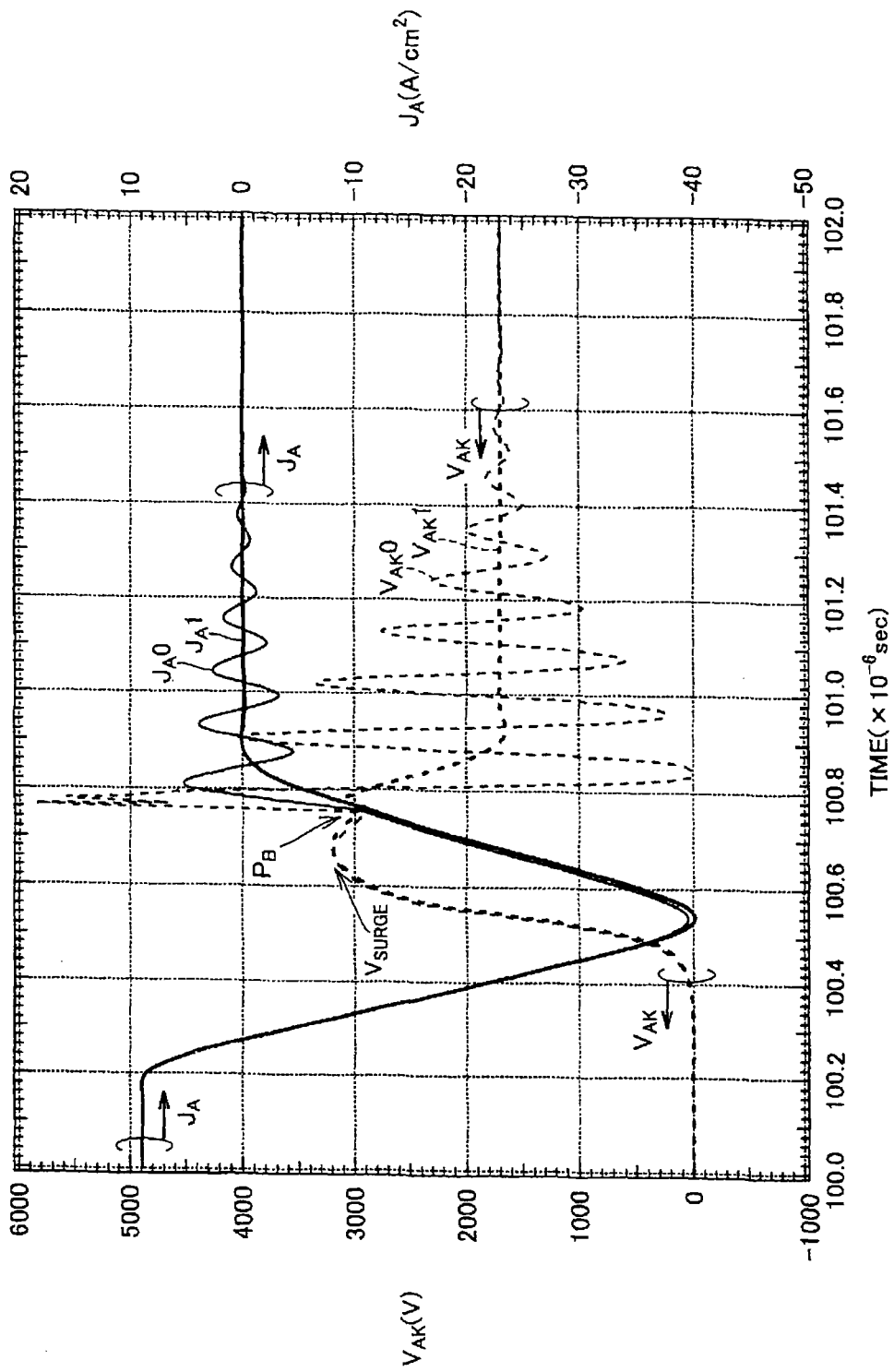
FIG. 4 is a graph showing an example of the simulations for the recovery characteristic waveform with regard to each diode in FIG. 1 and in the comparative example.

Referring to FIG. 4, with regard to the present example and the comparative example, simulations were performed for the recovery characteristic waveform, that is, changes over time of a voltage $V_{AK}$ and a current density $J_A$ during the recovery. The figure shows a voltage $V_{AK}1$ and a current density $J_A1$ in the case of the diode in the present example (FIG. 1), and shows a voltage $V_{AK}0$ and a current density $J_A0$ in the case of the diode in the comparative example (FIG. 26). In the present example, the oscillation occurring during the recovery can be suppressed as compared to the case in the comparative example. Accordingly, a surge voltage $V_{surge}$ corresponding to a peak voltage of voltage $V_{AK}$ which is not less than 5000V in the comparative example can be suppressed approximately to 3000V in the present example.

It is to be noted that the simulation conditions are set such that coil LM is 12 μm, power supply VC is 1700V, a rated current density $J_AR$ is 90 A/cm$^2$, and a current $J_F$ in the forward direction is $J_AR/10$, and a temperature is 298 K.

Figure 5:
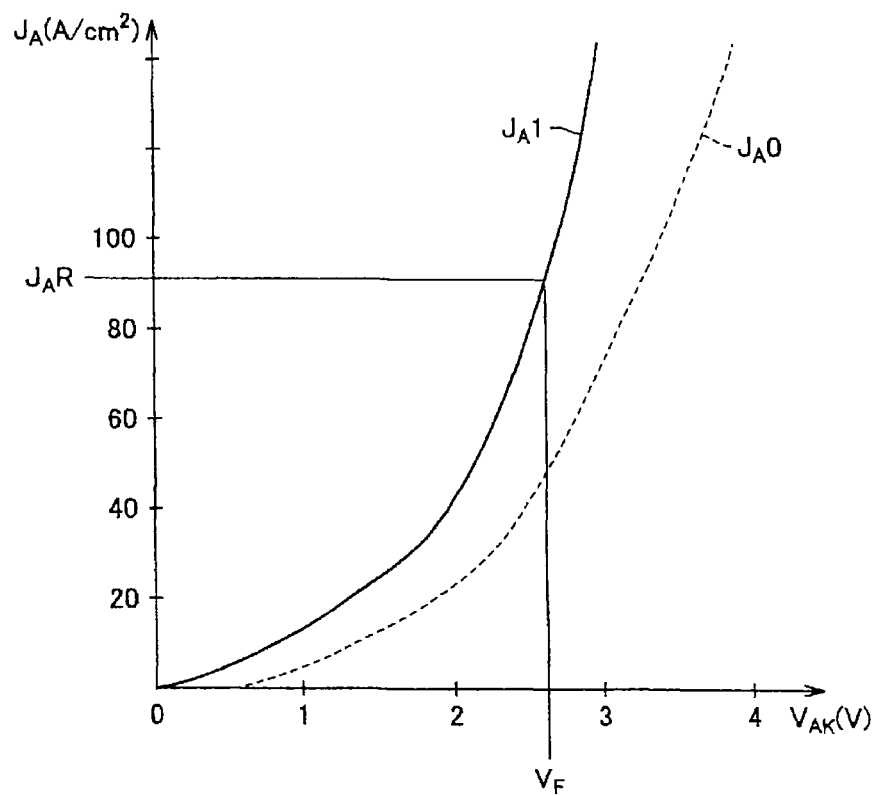
FIG. 5 is a graph showing an example of a relationship $J_A1$ between a voltage $V_{AK}$ and a current density $J_A$ in the forward direction of the diode in FIG. 1, and an example of a relationship $J_A0$ between a voltage $V_{AK}$ and a current density $J_A$ in the forward direction of the diode in the comparative example.
Figure 6:
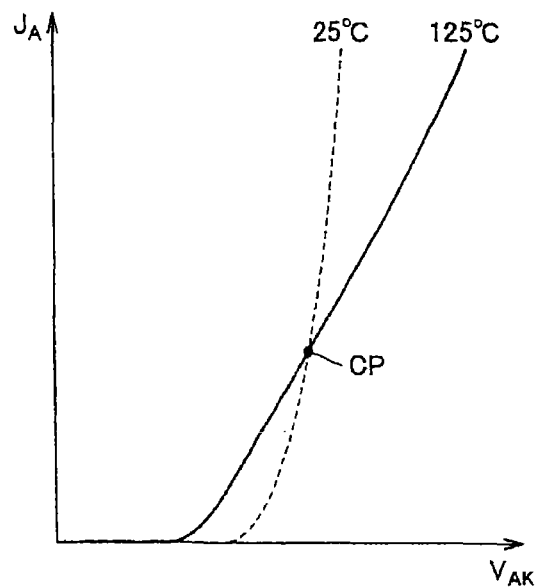
FIG. 6 is a diagram showing an example of the cross point at which relationships between voltage $V_{AK}$ and current density $J_A$ cross each other in accordance with the temperature change.

Referring to FIG. 5, simulations were performed for the characteristics of current density $J_A$-voltage $V_{AK}$. The figure shows a relationship $J_A1$ in the case of the diode in the example (FIG. 1) according to the present embodiment, and a relationship $J_A0$ in the case of the diode in the comparative example (FIG. 26). Furthermore, $V_F$ shows voltage $V_{AR}$ at the time when current density $J_A$ corresponds to rated current density $J_AR=90$ A/cm$^2$. According to the present example, $V_F$ can be decreased as compared to the case in the comparative example. In addition, the characteristics of current density $J_A$-voltage $V_{AR}$ generally vary with temperature. The characteristics of current density $J_A$-voltage $V_{AR}$ at temperatures of 25 20 C. and 12 ° C. are as shown in FIG. 6, for example. It is to be noted that the point at which the characteristic curves cross each other is assumed to be a cross point CP.

Figure 7:
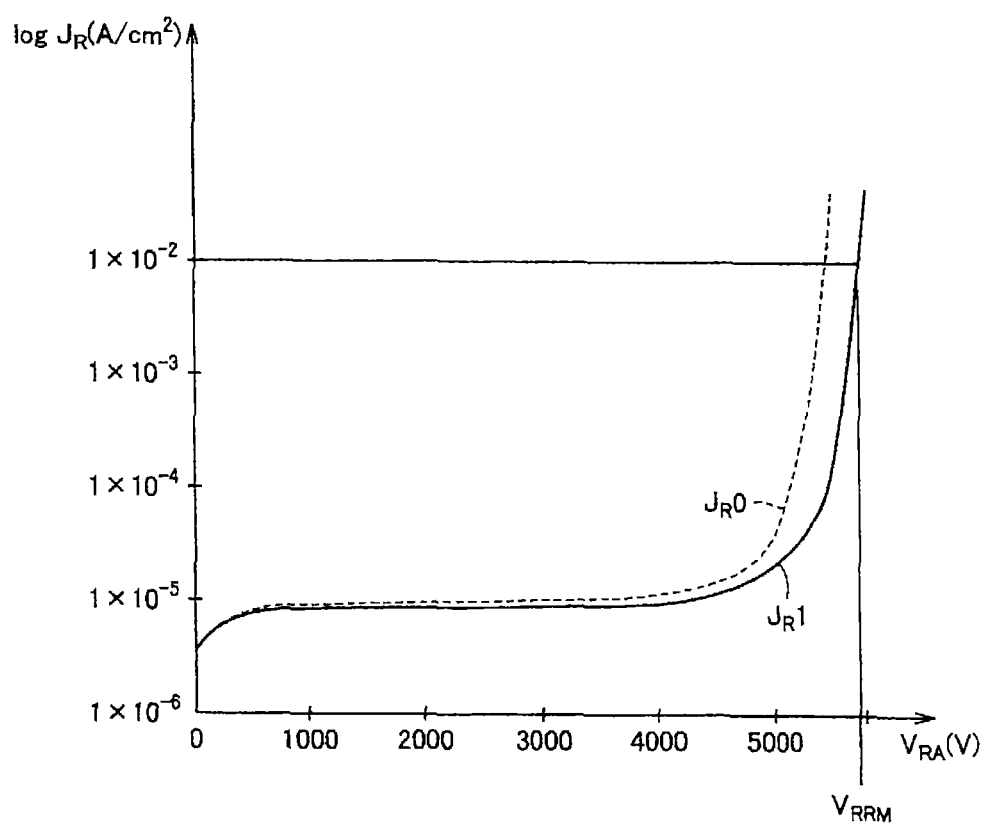
FIG. 7 is a graph schematically showing an example of a relationship $J_R1$ between a voltage $V_{RA}$ and a current density $J_R$ in the reverse direction of the diode in FIG. 1, and an example of a relationship $J_R0$ between voltage $V_{RA}$ and current density $J_R$ in the reverse direction of the diode in the comparative example.

Referring to FIG. 7, simulations were performed for the characteristics in the reverse direction (current density $J_R$-voltage $V_{RA}$). The figure shows a relationship $J_R1$ in the case of the diode in the present example (FIG. 1) and a relationship $J_R0$ in the case of the diode in the comparative example (FIG. 26). Furthermore, a maximum reverse voltage $V_{RRM}$ is assumed to be a voltage $V_{RA}$ at the time when current density $J_R=1\times10^{-2}$ A/cm$^2$. According to the present example, maximum reverse voltage $V_{RRM}$ can be increased as compared to the case in the comparative example.

In the case where n layer 15 substantially contains p-type conductive impurities, maximum reverse voltage $V_{RRM}$ is decreased. Conversely, in the case where n layer 15 substantially contains only the n-type conductive impurities, maximum reverse voltage $V_{RRM}$ is increased.

Figure 8:
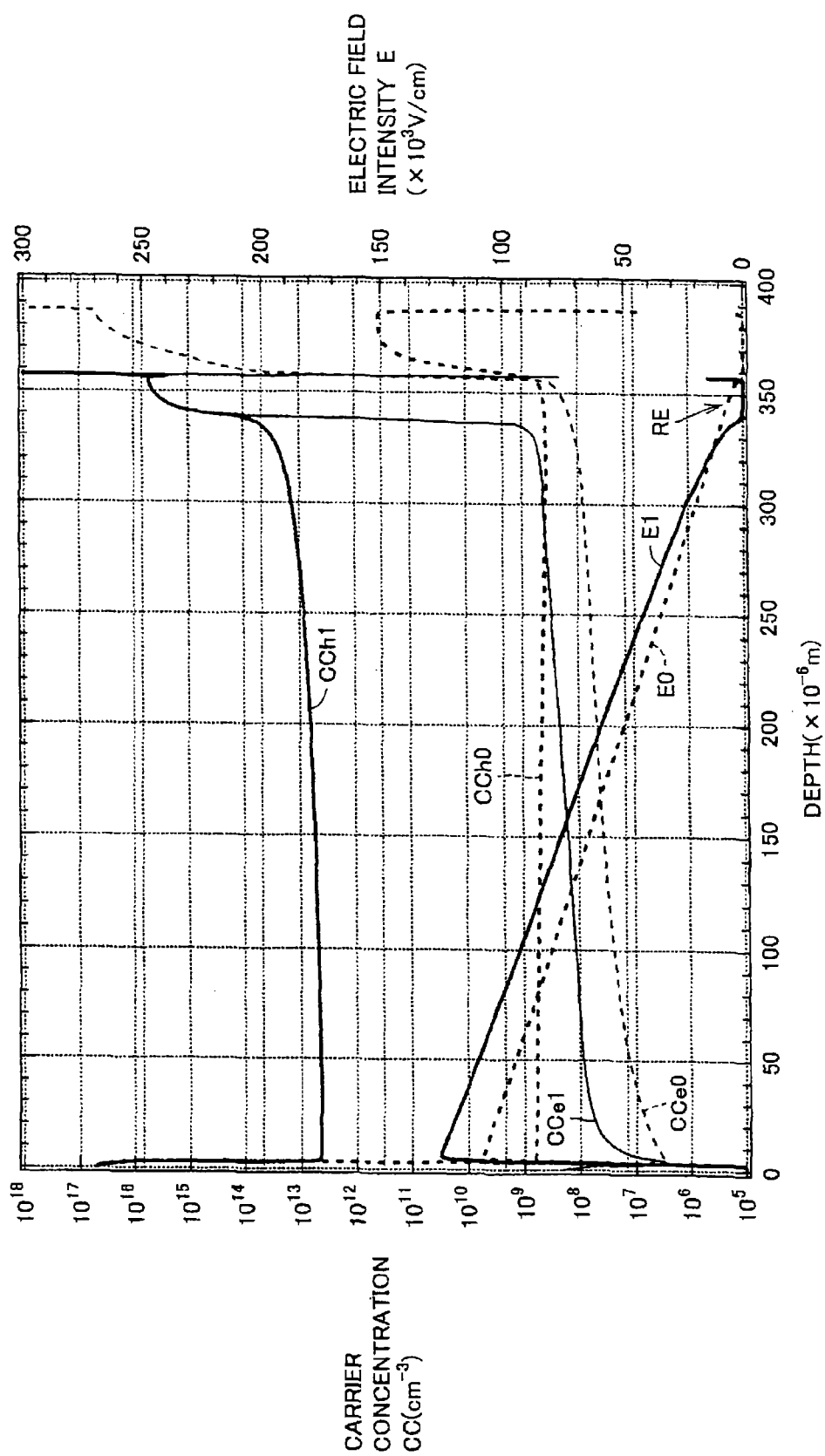
FIG. 8 is a graph schematically showing an electric field intensity E and a carrier concentration CC at a point $P_B$ in FIG. 4.
Figure 9:
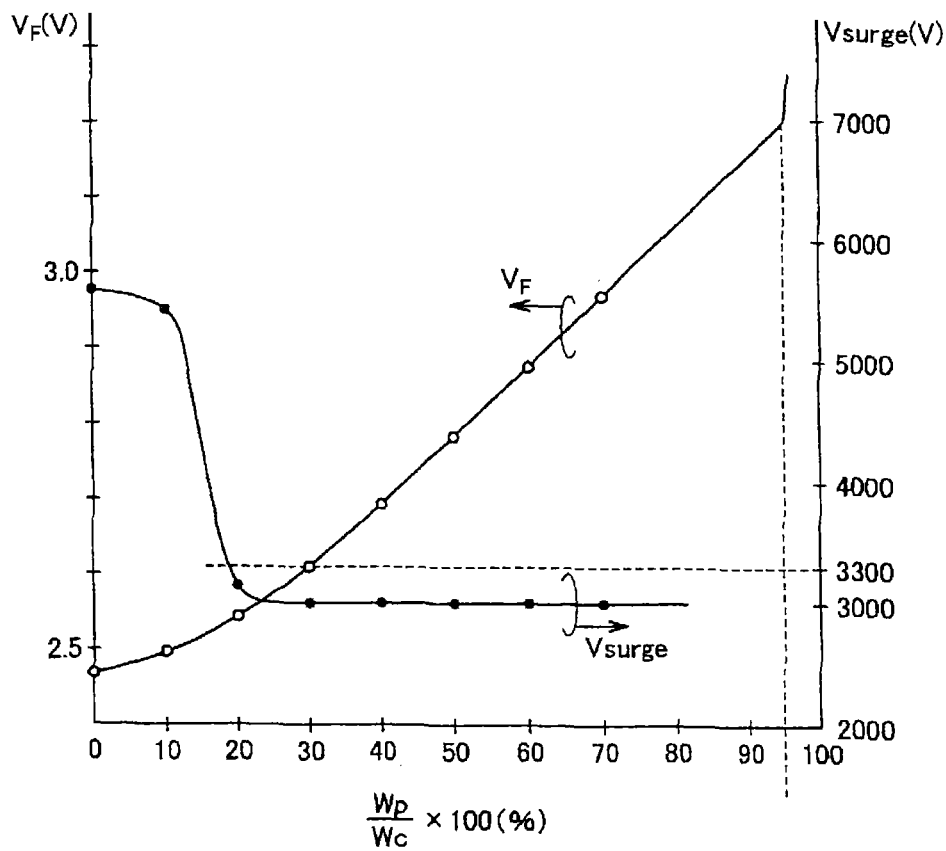
FIG. 9 is a graph showing an example of the relationship between each of a surge voltage $V_{surge}$ and $V_F$ at the rated current density in the diode in FIG. 1 and the ratio of a width $W_P$ of a p layer to a width $W_C$ of a cathode portion.
Figure 10:
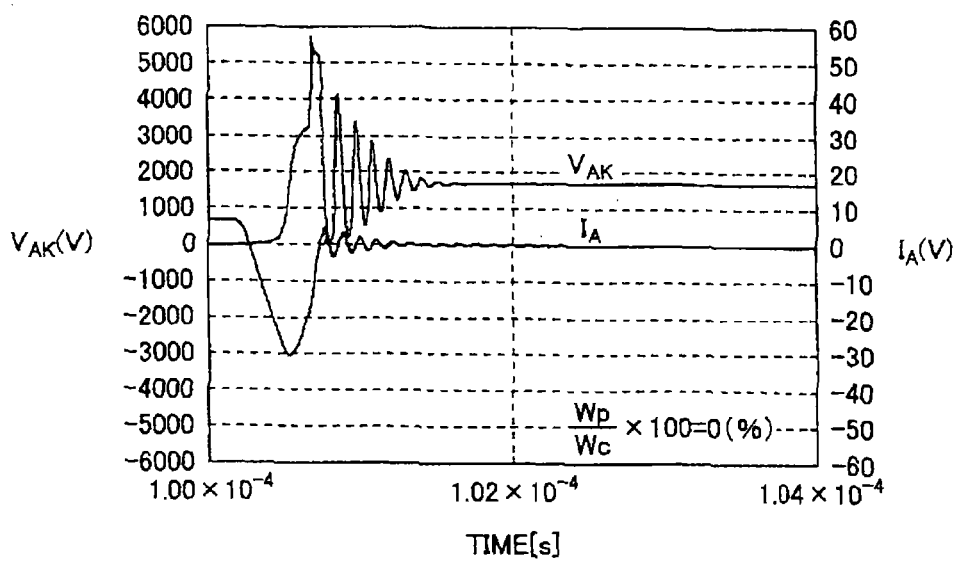
FIG. 10 is a graph showing an example of the recovery characteristics of the diode in the case where width $W_P$ of the p layer accounts for 0% of width $W_C$ of the cathode portion in FIG. 1.
Figure 11:
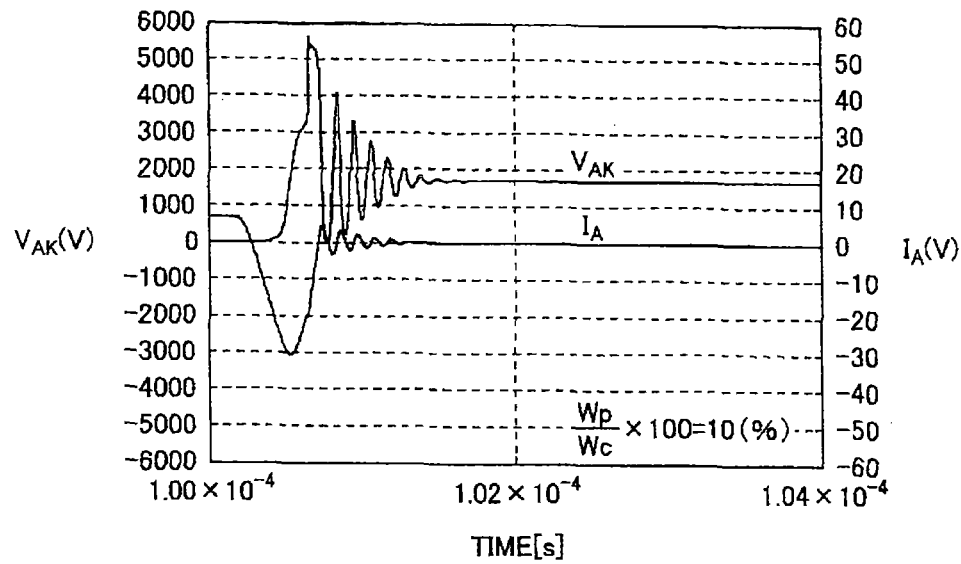
FIG. 11 is a graph showing an example of the recovery characteristics of the diode in the case where width $W_P$ of the p layer accounts for 10% of width $W_C$ of the cathode portion in FIG. 1.
Figure 12:
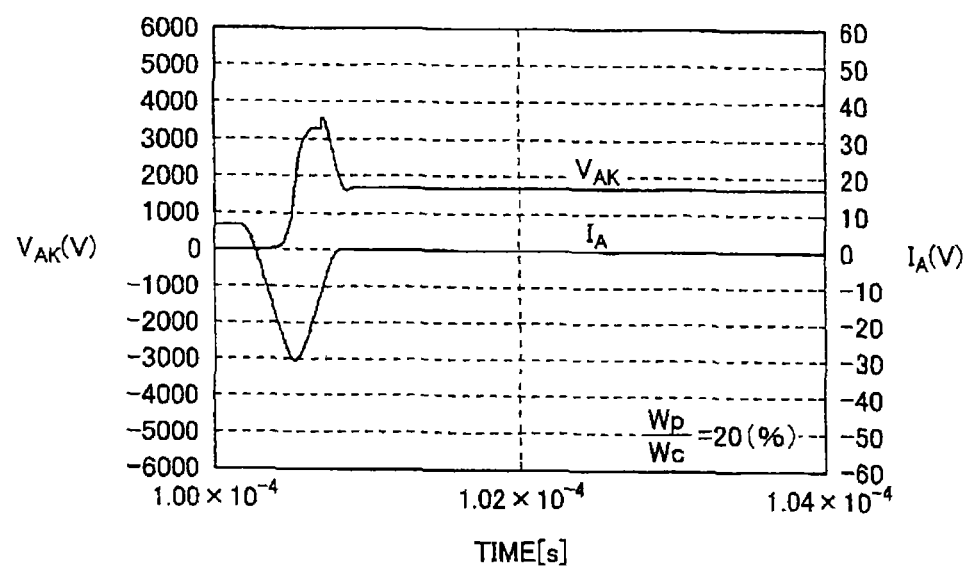
FIG. 12 is a graph showing an example of the recovery characteristics of the diode in the case where width $W_P$ of the p layer accounts for 20% of width $W_C$ of the cathode portion in FIG. 1.
Figure 13:
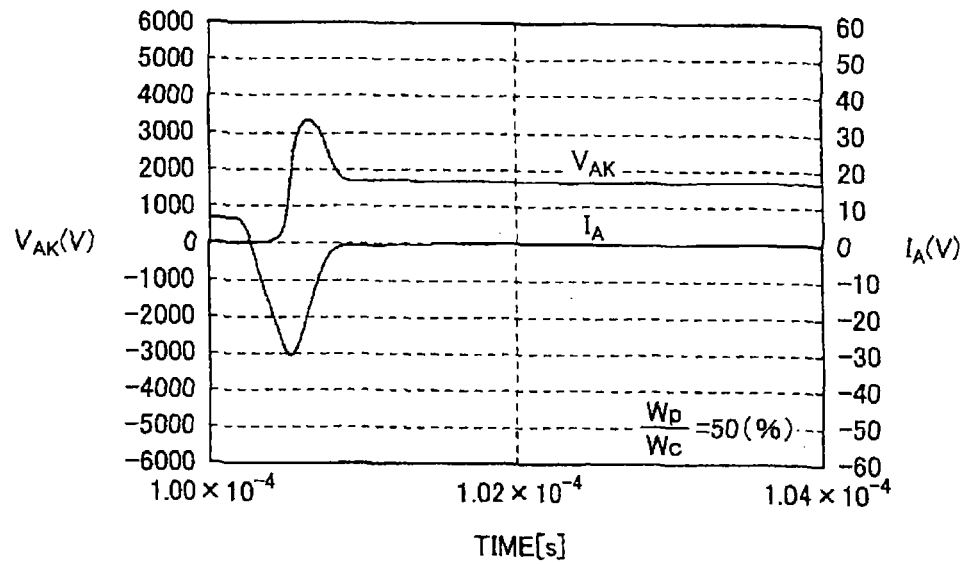
FIG. 13 is a graph showing an example of the recovery characteristics of the diode in the case where width $W_P$ of the p layer accounts for 50% of width $W_c$ of the cathode portion in FIG. 1.

Mainly referring to FIG. 8, the distributions of an electric field intensity E and a carrier concentration CC in the depth direction of the device at a point $P_B$ (FIG. 4) were analyzed by simulation. In the figure, the horizontal axis corresponds to a depth along an arrow $D_A$ (FIG. 1). Furthermore, the figure shows a hole concentration CCh1, an electron concentration CCe1 and an electric field intensity E1 in the case of the diode in the present example (FIG. 1), and also shows a hole concentration CCh0, an electron concentration CCe0 and an electric field intensity E0 in the case of the diode in the comparative example (FIG. 26). According to the configuration in the present example (FIG. 1), when holes are injected from p region 16 located close to the cathode side during the recovery phenomenon, hole concentration CCh1 on the cathode side is improved as compared to the case of hole concentration CCh0 in the comparative example. Consequently, as indicated by an arrow RE in the figure, the electric-field relaxation phenomenon occurs in which electric field intensity E on the cathode side is reduced.

Mainly referring to FIGS. 9-13, in order to examine the correlation (FIG. 9) of each of $V_F$ (FIG. 5) and surge voltage $V_{surge}$ (FIG. 4) with a width ratio $W_p/W_c$ (FIG. 1), simulations (for example, FIGS. 10-13) were performed for the recovery characteristic waveform (changes over time of a current $I_A$ and voltage $V_{AK}$ during recovery) under various ratios $W_p/W_c$.

As a result, in the case where width $W_p$ accounts for 20% or more of width $W_c$, that is, in the case where the area of p region 16 accounts for 20% or more of the total area of n$^+$ region 2 and p region 16 (FIG. 1), the oscillation is suppressed during the recovery, which allows surge voltage $V_{surge}$ to be remarkably suppressed to 3300V or lower that is a rated voltage.

Furthermore, when width $W_p$ exceeds 95% of width $W_c$, $V_F$ increases rapidly which may affect the operation of the diode. Conversely, as width $W_p$ is set to account for 95% or less of width $W_c$, that is, as the area of p region 16 is set to account for 95% or less of the total area of n$^+$ region 2 and p region 16, $V_F$ is remarkably suppressed.

Figure 14:
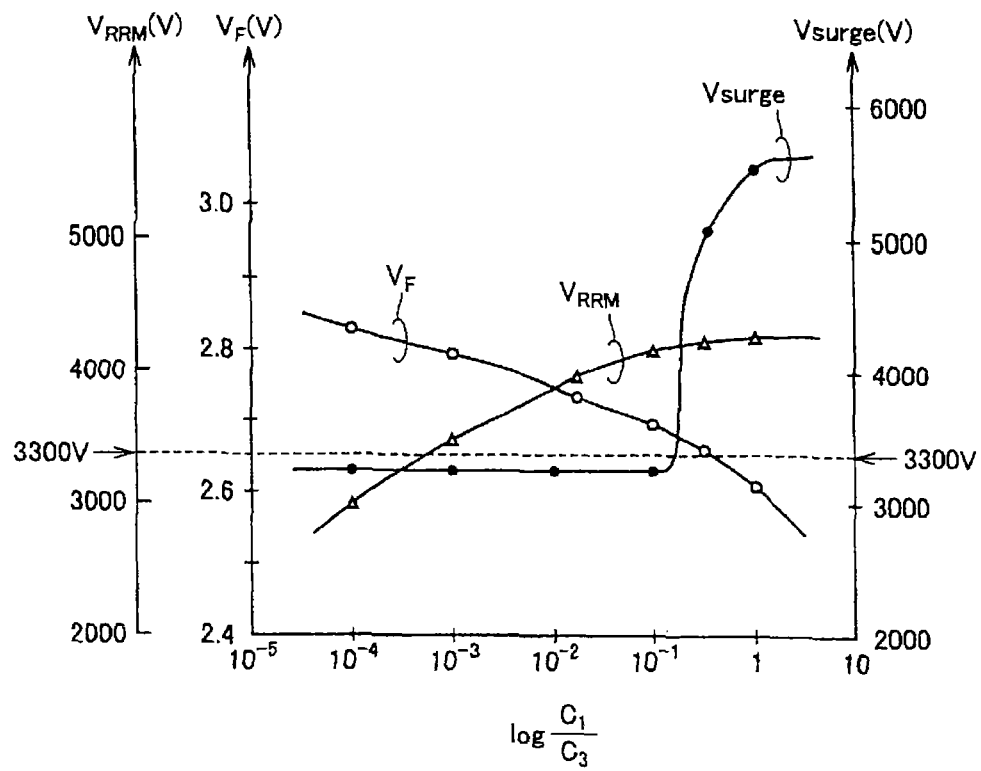
FIG. 14 is a graph showing an example of the relationship between each of a maximum reverse voltage $V_{RRM}$, $V_F$ at the rated current density and surge voltage $V_{surge}$ in the diode in FIG. 1, and a ratio $C_1/C_3$ of peak values $C_1$ and $C_3$ of the impurity concentration in FIG. 2.

Mainly referring to FIG. 14, the correlation of each of maximum reverse voltage $V_{RRM}$, $V_F$ and surge voltage $V_{surge}$ with the ratio $C_1/C_3$ of peak values $C_1$ and $C_3$ (FIG. 2) of the impurity concentration was examined by simulation. In light of the results shown in FIG. 9, width $W_p$ was set to account for 20% of width $W_c$ such that the oscillation during recovery might be suppressed.

The results of the simulations show that ratio $C_1/C_3$ is set to be $1\times10^{-1}$ or lower, to thereby allow surge voltage $V_{surge}$ to be remarkably suppressed to 3300V or lower which corresponds to a rated voltage.

The results also show that ratio $C_1/C_3$ is set to be $1\times10^{-3}$ or more, to thereby allow maximum reverse voltage $V_{RRM}$ (FIG. 7) to be maintained at 3300V or more which corresponds to a rated voltage. It is considered that this is because ratio $C_1/C_3$ is set to be $1\times10^{-3}$ or more, which allows suppression of extension of the depletion layer from the junction of p layer 3/n$^-$ drift layer 1 serving as a main junction toward the cathode side.

Figure 15:
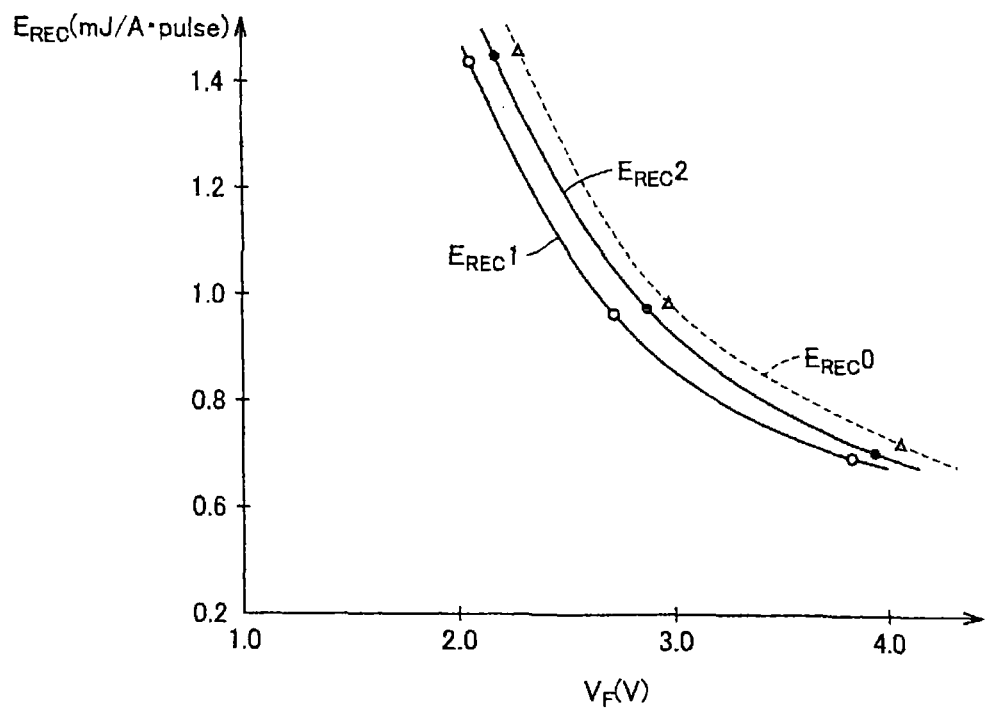
FIG. 15 is a graph showing an example of a characteristic curve $E_{REC}1$ illustrating trade-off characteristics between a recovery loss $E_{REC}$ and $V_F$ at the rated current density of the diode in FIG. 1 in the case where a peak value $C_2$ is higher than $C_1$ in FIG. 2; an example of a characteristic curve $E_{REC}2$ illustrating the relationship between recovery loss $E_{REC}$ and $V_F$ at the rated current density of the diode in FIG. 1 in the case where peak value $C_1$ is equal to peak value $C_2$ in FIG. 2; and an example of a characteristic curve $E_{REC}0$ illustrating the relationship between recovery loss $E_{REC}$ and $V_F$ at the rated current density of the diode in the comparative example.

Referring to FIG. 15, simulations were performed to examine the trade-off characteristics between recovery loss $E_{REC}$ (mJ/A·pulse) and $V_F$ (V). The figure shows a characteristic curve $E_{REC}1$ in the case where peak values $C_1$ and $C_2$ of the impurity concentration (FIG. 2) satisfy the relation of $C_2<C_1$, and a characteristic curve $E_{REC}2$ in the case where peak values $C_1$ and $C_2$ satisfy the relation of $C_2=C_1$. The figure also shows a characteristic curve $E_{REC}0$ in the case of the diode in the comparative example (FIG. 26).

The results show that, as compared to the configuration (characteristic curve $E_{REC}0$) in the comparative example (FIG. 26), the configuration (characteristic curves $E_{REC}1$ and $E_{REC}2$) in the present example (FIG. 1) serves to achieve an improvement in the trade-off relationship between recovery loss $E_{REC}$ and $V_F$, and also achieve a further improvement particularly in the case where peak values $C_1$ and $C_2$ of the impurity concentration satisfy the relation of $C_2>C_1$. In other words, it is found that the above-described trade-off relationship can be improved while maintaining dimension t3 (FIGS. 1 and 26) in terms of the SOA, that is, without the need to decrease dimension t3.

Figure 16:
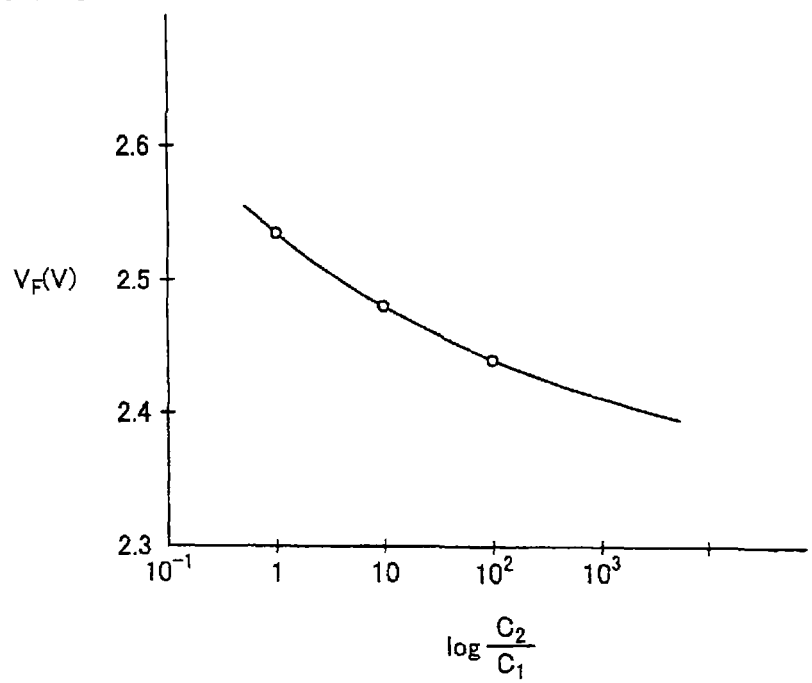
FIG. 16 is a graph showing an example of the relationship between $V_F$ at the rated current density in the diode in FIG. 1 and a ratio $C_2/C_1$ of peak values $C_1$ and $C_2$ of the impurity concentration in FIG. 2.

It is to be noted that $V_F$ decreases with an increase in ratio $C_2/C_1$ of the peak values of the impurity concentration, as shown in FIG. 16.

Figure 17:
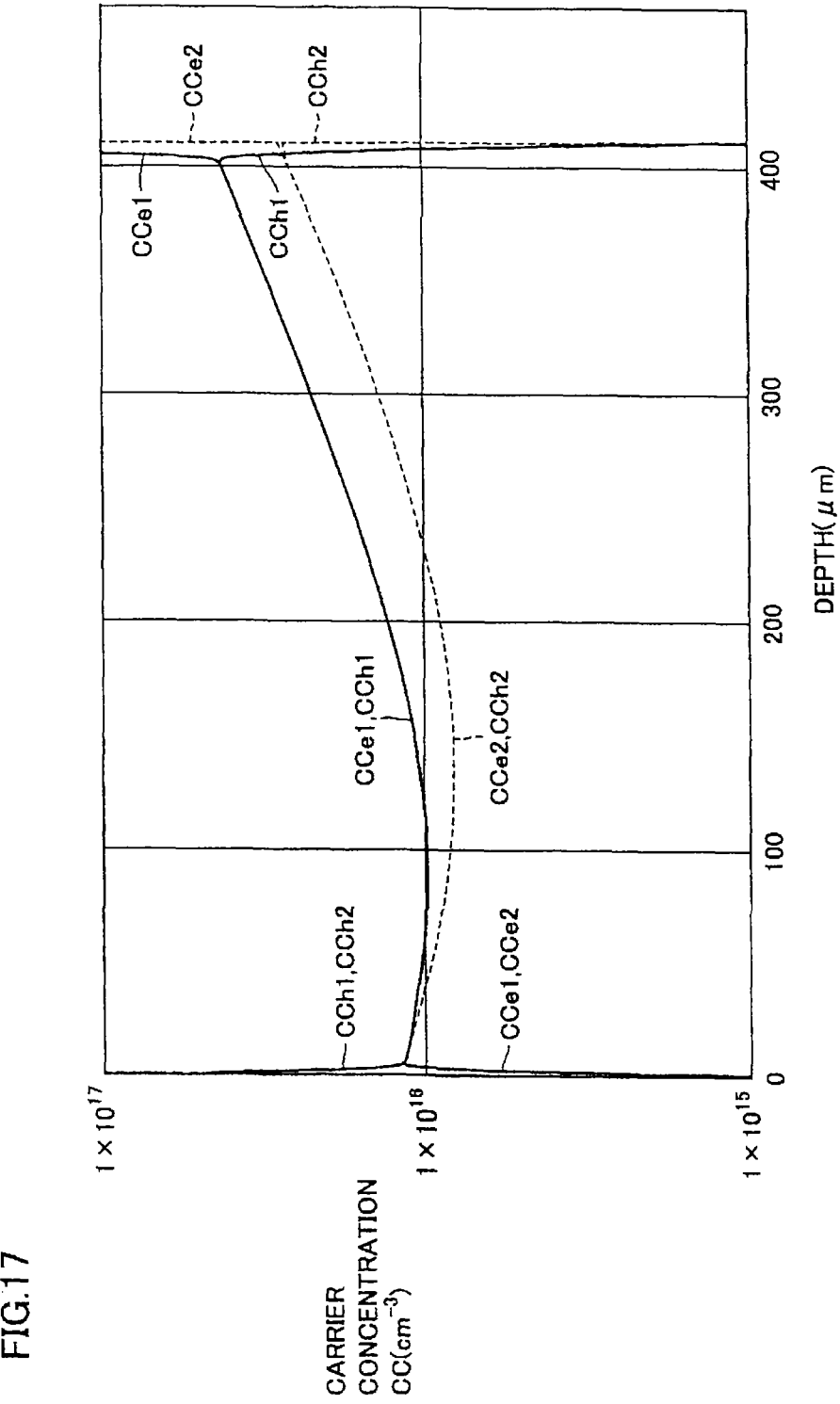
FIG. 17 is a graph showing an example of a hole concentration CCh1 and an electron concentration CCe1 along an arrow $D_A$ (FIG. 1) in the ON state in the case where peak value $C_2$ is higher than $C_1$ in FIG. 2; and an example of a hole concentration CCh2 and an electron concentration CCe2 along arrow $D_A$ (FIG. 1) in the ON state in the case where peak value $C_1$ is equal to $C_2$ in FIG. 2.

FIG. 17 shows the simulation results of carrier concentration CC in the ON state, that is, in the case where current density $J_A$ is equal to rated current density $J_AR$ (FIG. 5). In the figure, the horizontal axis corresponds to a depth along arrow $D_A$ (FIG. 1). Furthermore, the figure shows hole concentration CCh1 and electron concentration CCe1 in the case where peak values $C_1$ and $C_2$ of the impurity concentration satisfy the relation of $C_2>C_1$, and also shows a hole concentration CCh2 and an electron concentration CCe2 in the case where peak values $C_1$ and $C_2$ of the impurity concentration satisfy the relation of $C_2=C_1$.

The results described above show that, when peak values $C_1$ and $C_2$ satisfy the relation of $C_2>C_1$, the carrier concentration near the cathode is increased in the ON state. It is considered that this increase in carrier concentration causes a decrease in $V_F$ (FIG. 16), with the result that the trade-off relationship between recovery loss $E_{REC}$ and $V_F$ (FIG. 15) is improved.

According to the present embodiment, $V_F$ is decreased, the oscillation at the time of recovery is suppressed, and maximum reverse voltage $V_{RRM}$ is improved, which will be hereinafter described in detail.

According to the diode structure (FIG. 1) in the present embodiment, when holes are injected from p region 16 during the recovery phenomenon, hole concentration CCh1 (FIG. 8) on the cathode side is increased above hole concentration CCh0 in the case of the diode structure (FIG. 26) according to the comparative example. Consequently, in the present embodiment, the electric field on the cathode side is relaxed as indicated by arrow RE (FIG. 8) during the recovery, as compared to the case in the comparative example, which allows suppression of extension of the depletion layer from the junction of p layer 3/n⁻ drift layer 1 serving as a main junction toward the cathode side. Accordingly, the oscillation phenomenon during the recovery is suppressed as shown in FIG. 4, resulting in improvement of the SOA tolerance of the diode. Thus, according to the diode of the present embodiment (FIG. 1), the oscillation can be suppressed by injecting holes from p region 16 during the recovery phenomenon to thereby cause electric-field relaxation (to suppress extension of the depletion layer). Consequently, thickness t3 of n⁻ drift layer 1 can be reduced, and thus, the trade-off characteristics between recovery loss $E_{REC}$ and $V_F$ can be improved as shown in FIG. 15.

The proportion of the area of p region 16 occupying the area of cathode layer CLa in FIG. 1 (ratio $W_p/W_c$ between widths $W_p$ and $W_c$ in FIG. 1) serves as an important parameter for facilitating hole injection from the cathode side during the recovery operation. In other words, as shown in FIG. 4, $V_F$ and surge voltage $V_{surge}$ greatly vary significantly depending on this parameter. According to the present embodiment, as the following expression (1) is satisfied, an excellent operation of the diode can be ensured while suppressing the oscillation at the time of recovery.

$$20\% \leq \text{ratio } W_p/W_c \leq 95\% \tag{1}$$

In the above expression (1), the upper limit value, 95%, represents a condition for sufficiently decreasing $V_F$ (FIG. 9) for practical application. Furthermore, the lower limit value, 20%, represents a condition for remarkably suppressing a waveform surge in the $V_{AK}$ waveform (FIGS. 10 to 13), that is, $V_{surge}$ (FIG. 9), to not more than the value of the breakdown voltage class (3300V in the above-described simulations). As expression (1) is satisfied in this way, $V_F$ is decreased and the oscillation during recovery is suppressed.

As described above, ratio $C_1/C_3$ (FIG. 14) of peak values $C_1$ and $C_3$ (FIG. 2) of the impurity concentration satisfies the following expression (2) while decreasing $V_F$ and suppressing the oscillation at the time of recovery, which allows maximum reverse voltage $V_{RRM}$ to be improved.

$$0.001 \leq \text{ratio } C_1/C_3 \leq 0.1 \tag{2}$$

In the above expression (2), the upper limit value, 0.1, represents a condition for suppressing $V_{surge}$ to not more than the value of the breakdown voltage class (3300V in the above-described simulations) by injecting sufficient holes from p region 16 of cathode layer CLa. Furthermore, the lower limit value, 0.001, represents a condition for preventing a decrease in maximum reverse voltage $V_{RRM}$ resulting from the fact that the depletion layer extending toward the cathode side from the junction of p layer 3/n⁻ drift layer 1 serving as a main junction during application of a reverse bias reaches p region 16.

Furthermore, peak values $C_1$ and $C_2$ of the impurity concentration (FIG. 2) satisfy the following expression (3), which causes an increase in carrier concentration CC on the cathode side (FIG. 17) at the time when the diode is in the ON state.

$$C_2 > C_1 \tag{3}$$

As described above, the increased carrier concentration CC results in a decrease in $V_F$ (FIG. 16), and accordingly, the trade-off characteristics between recovery loss $E_{REC}$ and $V_F$ (FIG. 15) is improved.

In the case where the above-described relations (1) to (3) are satisfied, a diode having particularly excellent characteristics can be achieved as compared to the diode in the comparative example (FIG. 26).

(Second Embodiment)

Figure 18:
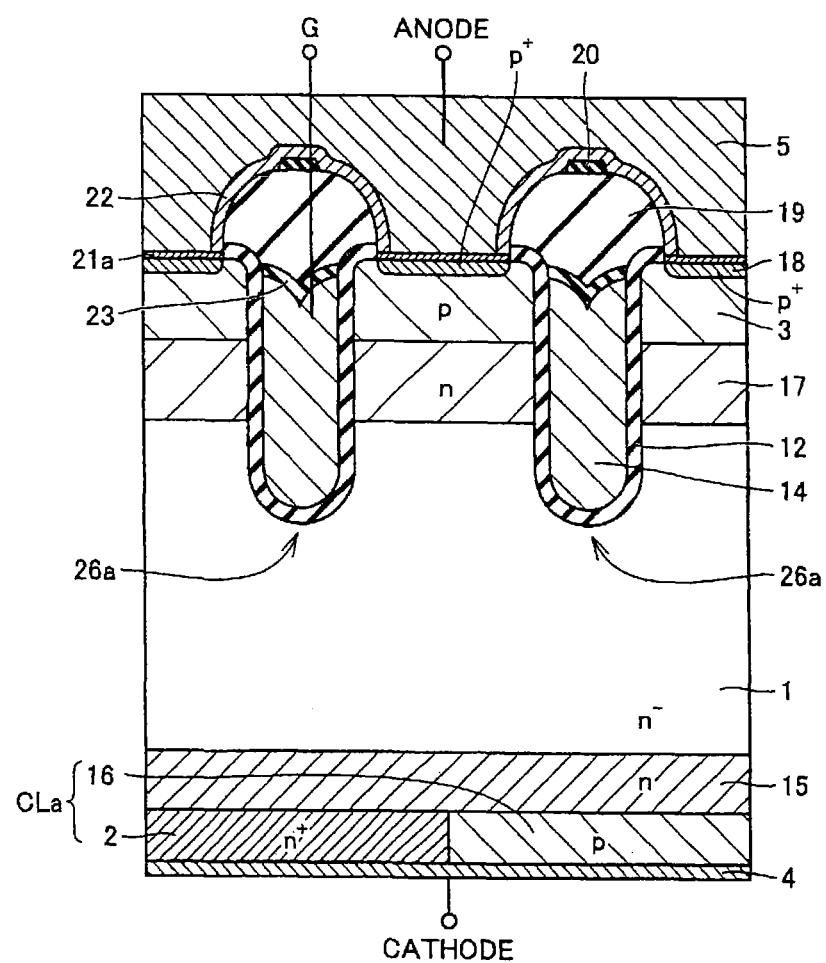
FIG. 18 is a cross-sectional view schematically showing the configuration of the diode as a semiconductor device in the second embodiment of the present invention.

Referring to FIG. 18, a diode as a semiconductor device according to the present embodiment includes an n-type diffusion layer 17 (the fifth layer), a trench structure 26a, a p⁺ diffusion layer 18, an interlayer dielectric film 19, insulation films 20 and 23, a silicide layer 21a, and a barrier metal layer 22.

N-type diffusion layer 17 is located between a p layer 3 and an n⁻ drift layer 1, and has an n-type. Trench structure 26a has a trench extending through p layer 3 and n-type diffusion layer 17 and also has a gate electrode 14 filling the trench with a gate insulation film 12 interposed therebetween. Gate electrode 14 is electrically insulated from an anode electrode 5 by interlayer dielectric film 19. Silicide layer 21a serves to implement a low contact resistance with an Si diffusion layer and is, for example, made of $TiSi_2$, CoSi or WSi. Barrier metal layer 22 is, for example, made of TiN. Interlayer dielectric film 19 is made of a silicate glass film to which boron, phosphorus and the like are added.

It is to be noted that since the configurations other than those described above are almost the same as the configuration according to the above-described first embodiment, the same or corresponding components are designated by the same reference characters, and description thereof will not be repeated. The method for manufacturing the diode according to the present embodiment will then be described.

First, a substrate which is a thick n⁻ drift layer 1 is prepared. The impurity concentration of n⁻ drift layer 1 is determined depending on the breakdown voltage class and is set to be $1 \times 10^{12}$ to $1 \times 10^{15} \text{cm}^{-3}$ in 600 to 6500V class, for example.

Then, p layer 3 is formed on the surface of this substrate with n-type diffusion layer 17 interposed therebetween. For example, p layer 3 has a peak concentration of $1 \times 10^{16}$ to $1 \times 10^{18} \text{cm}^{-3}$ and a diffusion depth of 1 to 4 µm. The peak concentration of the impurities in n-type diffusion layer 17 is equal to or higher than the concentration of the impurities in n⁻ drift layer 1 and is equal to or lower than the peak value of the impurity concentration in p layer 3. Then, p⁺ diffusion layer 18 is formed on the surface of the substrate on which p layer 3 and n-type diffusion layer 17 are formed. P⁺ diffusion layer 18 has, for example, a surface concentration of $1 \times 10^{18}$ to $1 \times 10^{20} \text{cm}^{-3}$ and a diffusion depth of approximately 0.5 µm. Trench structure 26a and a cathode layer CLa are then formed. It is to be noted that p⁺ diffusion layer 18 may be formed after trench structure 26a is formed.

The diode according to the present embodiment is used such that the electric potential lower than that of a cathode electrode 4 is applied to gate electrode 14 when the reverse voltage is applied to the diode. For the purpose of this, gate electrode 14 is electrically connected to anode electrode 5, for example. In addition, in the case where the electric potential of cathode electrode 4 is rendered positive when a reverse voltage is applied to the diode, gate electrode 14 may be grounded.

In this case, the simulation results show that a current density $J_A$ at a cross point CP (FIG. 6) can be decreased. Accordingly, the current density at cross point CP can be decreased below the current density at which the diode is overloaded. In this case, since the overloaded diode exhibits a positive temperature coefficient at $V_F$, the current concentration on the overloaded diode can be prevented.

Furthermore, the amount of hole injection from p layer 3 at the time when the device is turned on can be controlled by n-type diffusion layer 17.

Furthermore, trench structure 26a serves as a quasi-field plate structure, to facilitate extension of the depletion layer from the junction between p layer 3 and n-type diffusion layer 17, with the result that a maximum reverse voltage $V_{RRM}$ can be maintained. Also, as trench structure 26a is formed deeper than the interface between p layer 3 and n-type diffusion layer 17, maximum reverse voltage $V_{RRM}$ can be more reliably maintained.

Furthermore, according to the diode in the comparative example (FIG. 26), the trade-off characteristics between a recovery loss $E_{REC}$ and $V_F$ are controlled generally by adjusting the lifetime of carriers in n⁻ drift layer 1. In contrast, according to the present embodiment, the concentration in p layer 3 is adjusted to control the trade-off characteristics and expand the controllable range of the trade-off characteristics, and thus, eliminating the lifetime adjusting process, to thereby allow simplification of the wafer process.

Figure 19:
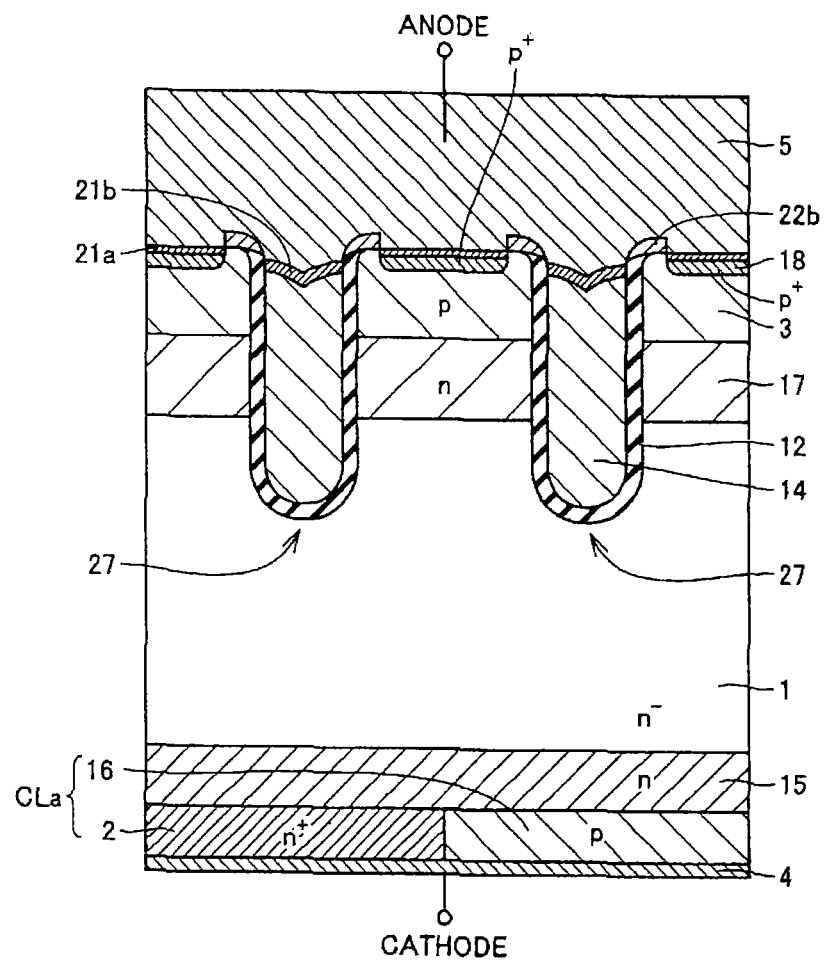
FIG. 19 is a cross-sectional view schematically showing the configuration of a modification of the diode in FIG. 18.

Referring to FIG. 19, a modification of the present embodiment will be described. The diode according to the present modification includes an n-type diffusion layer 17, a trench structure 27, a p⁺ diffusion layer 18, silicide layers 21a and 21b, and a barrier metal layer 22b. Trench structure 27 includes a trench extending through a p layer 3 and n-type diffusion layer 17 and also includes a gate electrode 14 filling the trench with a gate insulation film 12 interposed therebetween. In addition, gate electrode 14 is electrically connected to an anode electrode 5 and has the same electric potential as that of anode electrode 5.

According to the present modification, gate electrode 14 is applied with the same electric potential as that of anode electrode 5. Accordingly, when the voltage in the reverse direction is applied to the diode, the electric potential lower than that of cathode electrode 4 can be applied to gate electrode 14 without the need to control the electric potential of gate electrode 14 from outside the diode. Consequently, the effects similar to those in the present embodiment can be achieved.

(Third Embodiment)

Figure 20:
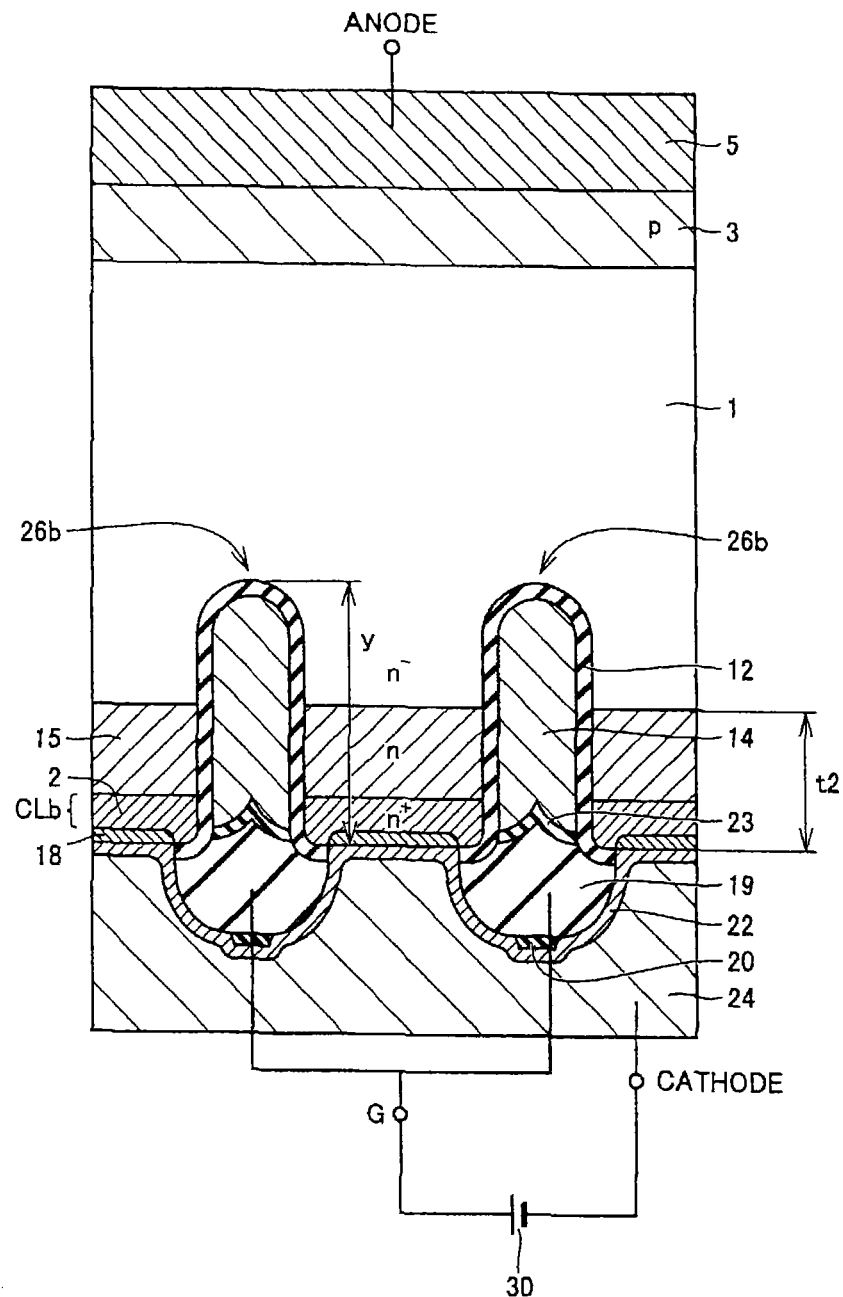
FIG. 20 is a cross-sectional view schematically showing the configuration of the diode as a semiconductor device in the third embodiment of the present invention.

Referring to FIG. 20, the diode as a semiconductor device according to the present embodiment includes an anode electrode 5 (the first electrode), a p layer 3 (the first layer), an n⁻ drift layer 1 (the second layer), an n layer 15 (the fourth layer), a cathode layer CLb (the third layer), a cathode electrode 24 (the second electrode), a trench structure 26b, an interlayer dielectric film 19, insulation films 20 and 23, and a barrier metal layer 22.

P layer 3 is located on anode electrode 5 and has a p-type (the first conductivity type). N⁻ drift layer 1 is located on p layer 3 and has a conductivity type different from the p-type, that is, an n-type (the second conductivity type).

Cathode layer CLb is located on n⁻ drift layer 1 with n layer 15 interposed therebetween. Cathode layer CLb includes an n⁺ region 2 (the first portion) having an n-type and having a peak value of the impurity concentration higher than the peak value of the impurity concentration in n⁻ drift layer 1.

N layer 15 is located between n⁻ drift layer 1 and cathode layer CLb. N layer 15 having an n-type has a peak value of the impurity concentration higher than the peak value of the impurity concentration in n⁻ drift layer 1, and also has a peak value of the impurity concentration lower than the peak value of the impurity concentration in n⁺ region 2.

Cathode electrode 24 is located on cathode layer CLb.

Trench structure 26b includes a trench extending through n⁺ region 2 and n layer 15 and also includes a gate electrode 14 filling the trench with gate insulation film 12 interposed therebetween. In other words, trench structure 26b is located in n⁺ region 2 and n layer 15.

Gate electrode 14 and cathode electrode 24 are connected to the positive terminal side and the negative electrode side, respectively, of a voltage source 30. Thus, trench structure 26b is configured such that the electric potential that is positive with respect to the electric potential of cathode electrode 24 may be applied.

Figure 21:
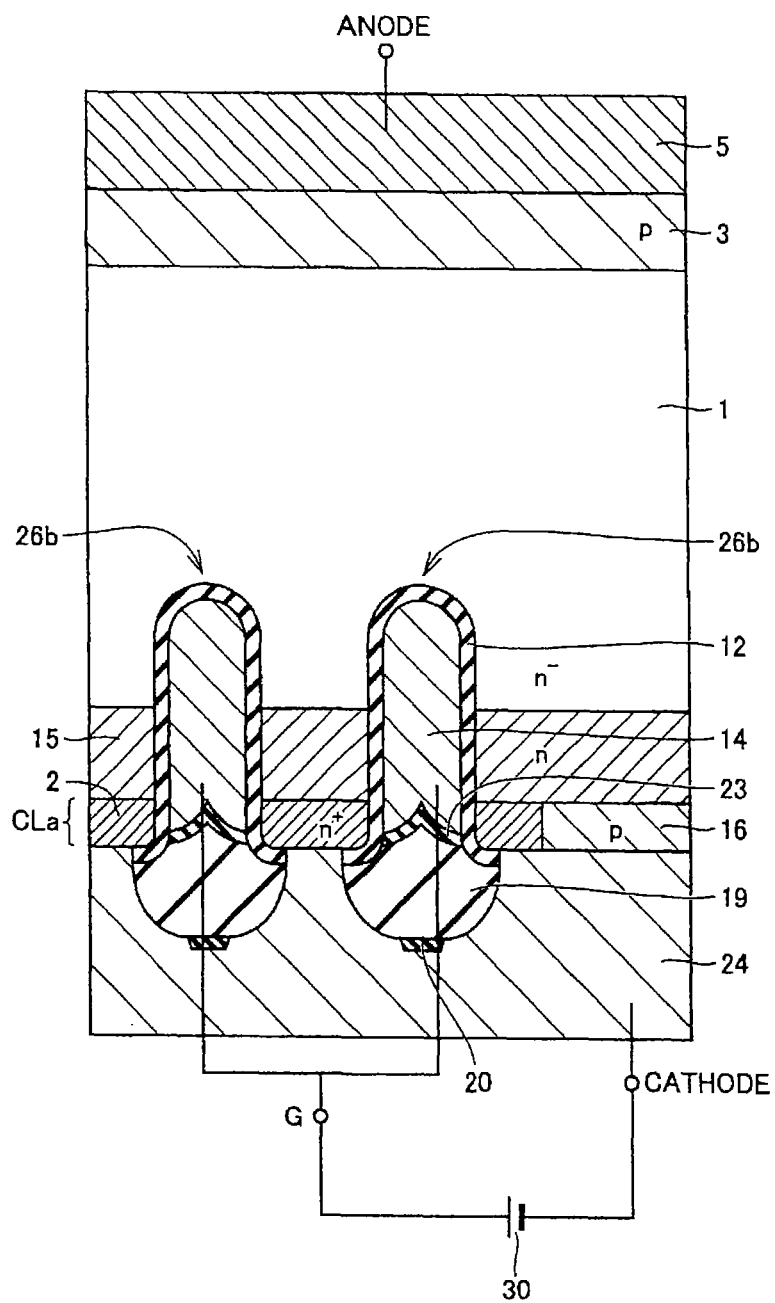
FIG. 21 is a cross-sectional view schematically showing the configuration of the first modification of the diode in FIG. 20.

It is to be noted that since the configurations other than those described above are almost the same as the configuration according to the above-described first embodiment, the same or corresponding components are designated by the same reference characters, and description thereof will not be repeated. Furthermore, it may be possible to apply the structure having cathode layer CLa in place of the above-described cathode layer CLb (FIG. 21) or the structure without having n layer 15.

The simulations similar to those in the first embodiment were performed in order to examine the characteristics of the diode according to the present embodiment. The simulation results will be hereinafter described.

Figure 23:
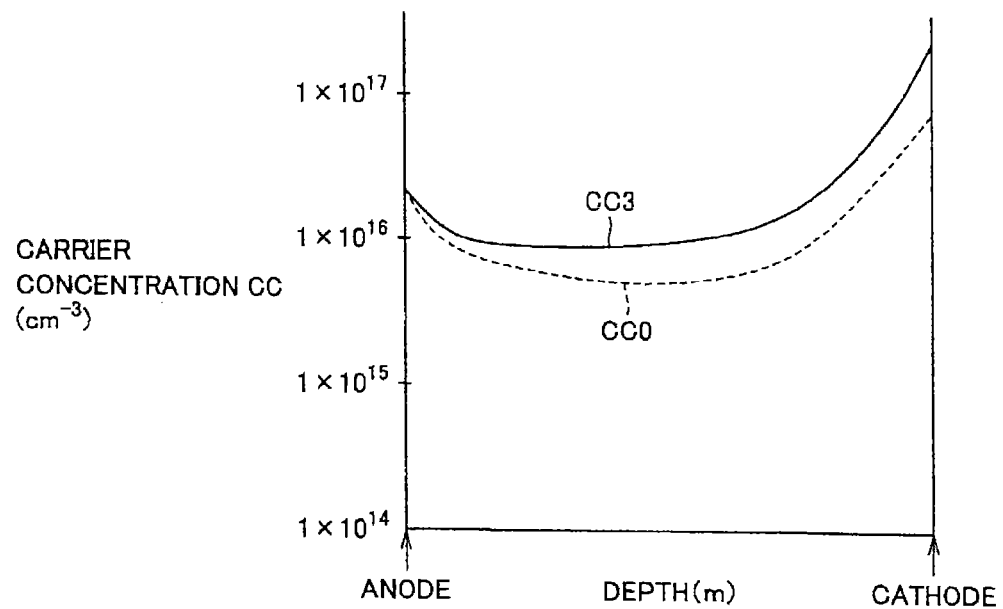
FIG. 23 is a graph showing an example of carrier concentrations CC3 and CC0 in the ON state in each diode in FIG. 20 and in the comparative example.

Referring to FIG. 23, simulations were performed for a carrier concentration CC in the ON state. The results show that a carrier concentration CC3 of the diode (FIG. 20) in the example of the present embodiment is higher than carrier concentration CC0 of the diode in the comparative example (FIG. 26). In other words, it is found that the carrier concentration near the cathode is increased in the ON state. It is considered that this increase in carrier concentration causes a decrease in $V_F$.

Figure 24:
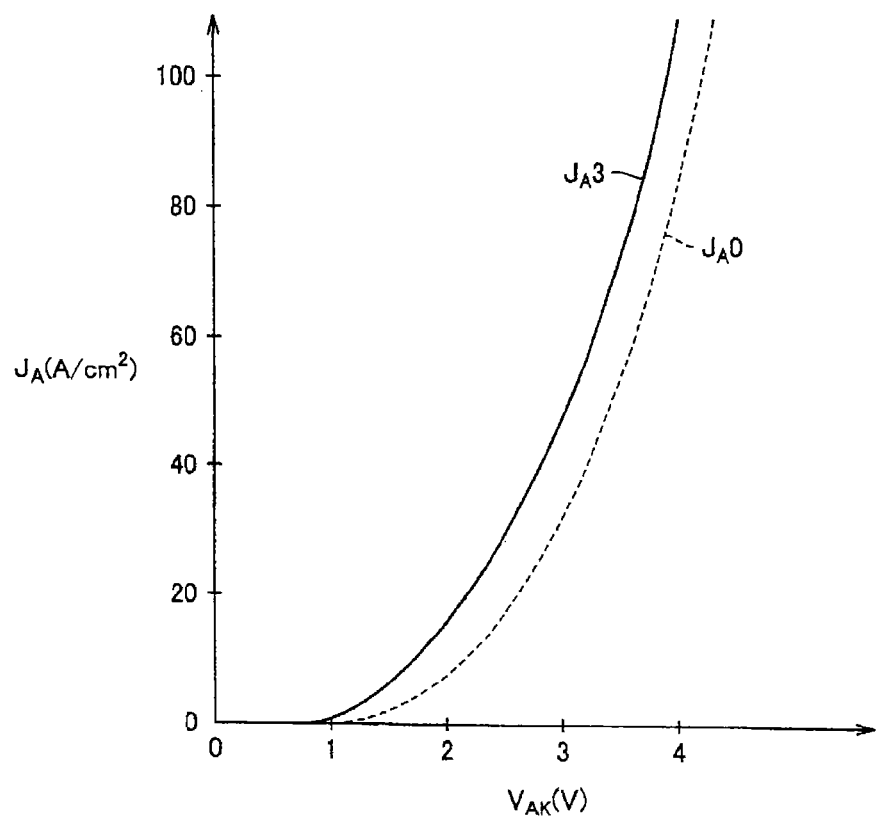
FIG. 24 is a graph showing an example of a relationship $J_A3$ between voltage $V_{AK}$ and current density $J_A$ in the forward direction of the diode in FIG. 20; and an example of a relationship $J_A0$ between voltage $V_{AK}$ and current density $J_A$ in the forward direction of the diode in the comparative example.

Referring to FIG. 24, simulations were performed for the characteristics of a current density $J_A$-a voltage $V_{AK}$. The figure shows a current density $J_A 3$ in the case of the diode in the present embodiment (FIG. 20) and a current density $J_A 0$ in the case of the diode in the comparative example (FIG. 26). According to the present embodiment, it is found that the characteristic curve of current density $J_A$-voltage $V_{AK}$ shifts in the direction in which voltage $V_{AK}$ is decreased on the horizontal axis on the graph, as compared to the case in the comparative example. In other words, it is found that $V_F$ can be decreased.

Figure 25:
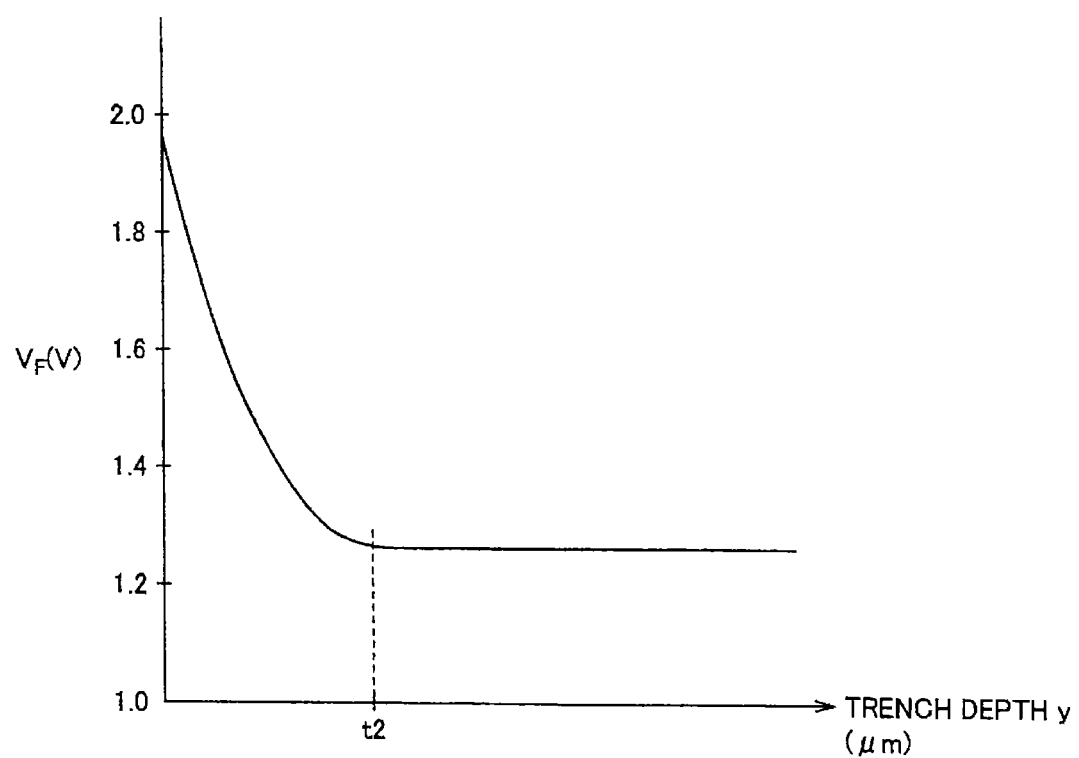
FIG. 25 is a graph showing an example of the relationship between a trench depth y in FIG. 20 and $V_F$ at the rated current density.

Referring to FIG. 25, simulations were performed for the correlation between a depth y of trench structure 26b and $V_F$. Consequently, it is found that $V_F$ can be further sufficiently decreased by setting trench depth y to a dimension t2 or more. In other words, it is found that $V_F$ can be further sufficiently decreased by providing trench structure 26b so as to extend through n⁺ region 2 and n layer 15.

According to the present embodiment, when a positive bias is applied to trench structure 26b located on the cathode side, an accumulation layer is formed on the sidewall of the trench, which causes an effect similar to that obtained in the case where n⁺ region 2 is expanded. Therefore, the electron injection from the cathode side can be facilitated at the time when the device is turned on, and consequently, $V_F$ can be decreased.

Figure 22:
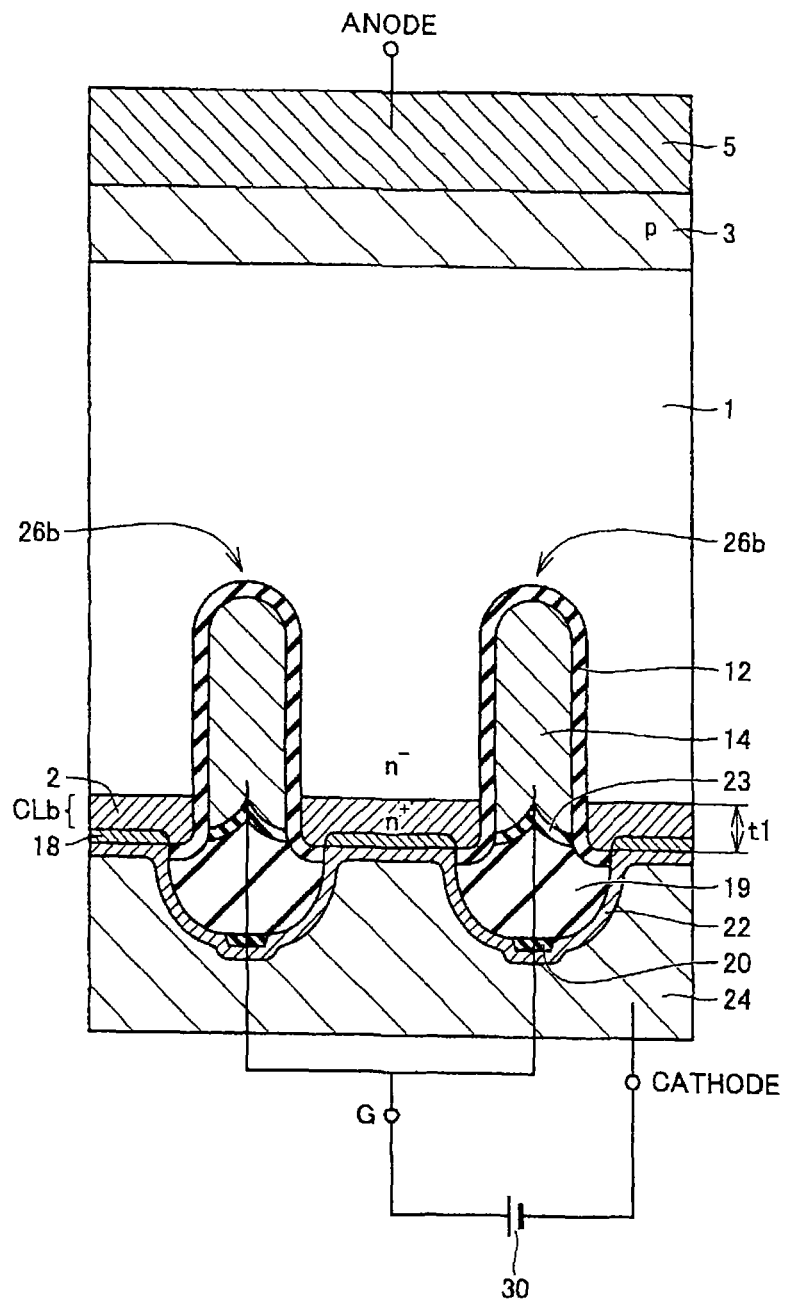
FIG. 22 is a cross-sectional view schematically showing the configuration of the second modification of the diode in FIG. 20.

Furthermore, $V_F$ can be further sufficiently decreased by providing trench structure 26b so as to extend through $n^+$ region 2 and n layer 15. In addition, in the modification (FIG. 22), trench structure 26b may be provided so as to extend through $n^+$ region 2.

Although the first and second conductivity types correspond to a p-type and an n-type, respectively, in each of the above-described embodiments, the present invention is not limited thereto, but the first and second conductivity types may correspond to an n-type and a p-type, respectively.

Although the diode has been described as a semiconductor device in each of the above-described embodiments, the semiconductor device according to the present invention is not limited to a diode alone, but may be a power module including a diode. Such a power module may include, for example, an IGBT.

Although the case where p layer 3, $n^-$ drift layer 1, n layer 15, and cathode layer CLa are made of Si to which conductive impurities are added has been described, similar effects can be obtained even when a wide band gap material such as SiC or GaN is used in place of Si.

Furthermore, although the case where the semiconductor device of a high breakdown voltage rated at 3300V class has been described as an example, the present invention can also be applied to those of other breakdown voltage classes.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a first electrode;
   a first layer located on said first electrode and having a first conductivity type;
   a second layer located on said first layer and having a second conductivity type different from said first conductivity type;
   a third layer located on said second layer and having a first portion, said first portion having said second conductivity type and having a peak value of an impurity concentration higher than the peak value of the impurity concentration in said second layer;
   a second electrode located on said third layer;
   a trench structure located in said first portion and said second layer
   a dielectric film;
   a third electrode disposed within said trench structure; and
   a diffusion layer located between said third layer and said second electrode and having said first conductivity type having a peak value of an impurity concentration higher than the peak value of the impurity concentration in said first layer, wherein
   said trench structure is completely surrounded by said second conductivity type in an area extending from said second layer to said third layer,
   said dielectric film is disposed between said third electrode and said second electrode,
   a first insulation film is disposed between said dielectric film and said third electrode,
   a second insulation layer is disposed between said dielectric film and said second electrode, and
   the second insulation layer is disposed between said third electrode and said second electrode.

2. The semiconductor device according to claim 1, wherein said trench structure extends through said first portion.

3. The semiconductor device according to claim 1, further comprising, between said second layer and said third layer, a fourth layer having said second conductivity type, having a peak value of an impurity concentration higher than the peak value of the impurity concentration in said second layer, and having a peak value of an impurity concentration lower than the peak value of the impurity concentration in said first portion.

4. The semiconductor device according to claim 3, wherein said trench structure extends through said first portion and said fourth layer.

5. The semiconductor device according to claim 1, further comprising a barrier metal layer disposed between said dielectric film and said second electrode.

6. The semiconductor device according to claim 5, wherein said second insulation layer is disposed between said dielectric film and said barrier metal layer.

7. The semiconductor device according to claim 1, further comprising a barrier metal layer disposed between said dielectric film and said second electrode, wherein said barrier metal layer is located between said diffusion layer and said second electrode.

8. The semiconductor device according to claim 7, wherein said diffusion layer is formed such that the barrier layer does not come into contact with said third layer.

* * * * *